(12) United States Patent
Goodwin et al.

(10) Patent No.: US 7,602,613 B2
(45) Date of Patent: *Oct. 13, 2009

(54) THIN MODULE SYSTEM AND METHOD

(75) Inventors: Paul Goodwin, Austin, TX (US); James W. Cady, Austin, TX (US); Douglas Wehrly, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/624,608

(22) Filed: Jan. 18, 2007

(65) Prior Publication Data

US 2007/0115017 A1   May 24, 2007

Related U.S. Application Data

(62) Division of application No. 10/934,027, filed on Sep. 3, 2004.

(51) Int. Cl.
*H05K 1/00* (2006.01)

(52) U.S. Cl. .................. 361/749; 361/803; 361/771; 361/720; 361/684; 361/719; 361/783; 361/767; 174/254

(58) Field of Classification Search .............. 361/767, 361/771, 720, 684, 803, 749, 785, 783, 719; 257/679, 706, 723, 686, 720, 707; 324/763; 439/633, 493, 629, 630, 631; 174/254
See application file for complete search history.

(56) References Cited

U.S. PATENT DOCUMENTS

| | | | |
|---|---|---|---|
| 3,372,310 A | 3/1968 | Kantor | |
| 3,436,604 A | 4/1969 | Hyttin | |
| 3,582,865 A | 6/1971 | Franck et al. | |
| 3,654,394 A | 4/1972 | Gordon | |
| 3,704,455 A | 11/1972 | Scarbrough | |
| 3,718,842 A | 2/1973 | Abbott, III et al. | |

(Continued)

FOREIGN PATENT DOCUMENTS

EP    122-687 (A)    10/1984

(Continued)

OTHER PUBLICATIONS

Complaint filed Mar. 8, 2007, in the United States District Court for the District of Massachusetts, Boston Division, Civil Action No. 07 CA 10468 DPW.

(Continued)

*Primary Examiner*—Dean A. Reichard
*Assistant Examiner*—Hoa C Nguyen
(74) *Attorney, Agent, or Firm*—Fish & Richardson P.C.

(57) ABSTRACT

A flexible circuit has contacts for mounting in a socket or card edge connector. The flexible circuit includes integrated circuit devices mounted on both sides of the edge connector contacts. Preferably, the flexible circuit is wrapped about an edge of a rigid substrate and presents contacts on both sides of the substrate for mounting in a socket. Multiple flexible circuits may be overlaid with the same strategy. The flexible circuit may exhibit one or two or more conductive layers, and may have changes in the layered structure or have split layers.

1 Claim, 17 Drawing Sheets

U.S. PATENT DOCUMENTS

| | | |
|---|---|---|
| 3,727,064 A | 4/1973 | Bottini |
| 3,746,934 A | 7/1973 | Stein |
| 3,766,439 A | 10/1973 | Isaacson |
| 3,772,776 A | 11/1973 | Weisenburger |
| 4,169,642 A | 10/1979 | Mouissie |
| 4,288,841 A | 9/1981 | Gogal |
| 4,342,069 A | 7/1982 | Link |
| 4,429,349 A | 1/1984 | Zachry |
| 4,437,235 A | 3/1984 | McIver |
| 4,495,546 A | 1/1985 | Nakamura |
| 4,513,368 A | 4/1985 | Houseman |
| 4,547,834 A | 10/1985 | Dumont et al. |
| 4,567,543 A | 1/1986 | Miniet |
| 4,587,596 A | 5/1986 | Bunnell |
| 4,645,944 A | 2/1987 | Uya |
| 4,656,605 A | 4/1987 | Clayton |
| 4,672,421 A | 6/1987 | Lin |
| 4,682,207 A | 7/1987 | Akasaki et al. |
| 4,696,525 A | 9/1987 | Coller et al. |
| 4,709,300 A | 11/1987 | Landis |
| 4,724,611 A | 2/1988 | Hagihara |
| 4,727,513 A | 2/1988 | Clayton |
| 4,733,461 A | 3/1988 | Nakano |
| 4,739,589 A | 4/1988 | Brehm et al. |
| 4,763,188 A | 8/1988 | Johnson |
| 4,771,366 A | 9/1988 | Blake et al. |
| 4,821,007 A | 4/1989 | Fields et al. |
| 4,823,234 A | 4/1989 | Konishi et al. |
| 4,833,568 A | 5/1989 | Berhold |
| 4,850,892 A | 7/1989 | Clayton et al. |
| 4,862,249 A | 8/1989 | Carlson |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 4,992,849 A | 2/1991 | Corbett et al. |
| 4,992,850 A | 2/1991 | Corbett et al. |
| 5,014,115 A | 5/1991 | Moser |
| 5,014,161 A | 5/1991 | Lee et al. |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,053,853 A | 10/1991 | Haj-Ali-Ahmadi et al. |
| 5,065,277 A | 11/1991 | Davidson |
| 5,099,393 A | 3/1992 | Bentlage et al. |
| 5,104,820 A | 4/1992 | Go et al. |
| 5,109,318 A | 4/1992 | Funari et al. |
| 5,117,282 A | 5/1992 | Salatino |
| 5,119,269 A | 6/1992 | Nakayama |
| 5,138,430 A | 8/1992 | Gow, 3rd et al. |
| 5,138,434 A | 8/1992 | Wood et al. |
| 5,140,405 A | 8/1992 | King et al. |
| 5,159,535 A | 10/1992 | Desai et al. |
| 5,173,840 A | 12/1992 | Kodai et al. |
| 5,191,404 A | 3/1993 | Wu et al. |
| 5,208,729 A | 5/1993 | Cipolla et al. |
| 5,214,845 A | 6/1993 | King et al. |
| 5,219,377 A | 6/1993 | Poradish |
| 5,222,014 A | 6/1993 | Lin |
| 5,224,023 A | 6/1993 | Smith et al. |
| 5,229,916 A | 7/1993 | Frankeny et al. |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewicz et al. |
| 5,247,423 A | 9/1993 | Lin et al. |
| 5,252,857 A | 10/1993 | Kane et al. |
| 5,259,770 A | 11/1993 | Bates et al. |
| 5,261,068 A | 11/1993 | Gaskins et al. |
| 5,268,815 A | 12/1993 | Cipolla et al. |
| 5,276,418 A | 1/1994 | Klosowiak et al. |
| 5,281,852 A | 1/1994 | Normington |
| 5,285,398 A | 2/1994 | Janik |
| 5,289,062 A | 2/1994 | Wyland |
| 5,309,986 A | 5/1994 | Itoh |
| 5,313,097 A | 5/1994 | Haj-Ali-Ahmadi et al. |
| 5,347,428 A | 9/1994 | Carson et al. |
| 5,362,656 A | 11/1994 | McMahon |
| 5,375,041 A | 12/1994 | McMahon |
| 5,386,341 A | 1/1995 | Olson et al. |
| 5,394,300 A | 2/1995 | Yoshimura |
| 5,397,916 A | 3/1995 | Normington |
| 5,400,003 A | 3/1995 | Kledzik |
| 5,428,190 A | 6/1995 | Stopperan |
| 5,438,224 A | 8/1995 | Papageorge et al. |
| 5,448,511 A | 9/1995 | Paurus et al. |
| 5,477,082 A | 12/1995 | Buckley, III et al. |
| 5,491,612 A | 2/1996 | Nicewarner, Jr. et al. |
| 5,502,333 A | 3/1996 | Bertin et al. |
| 5,523,619 A | 6/1996 | McAllister et al. |
| 5,523,695 A | 6/1996 | Lin |
| 5,541,812 A | 7/1996 | Burns |
| 5,572,065 A | 11/1996 | Burns |
| 5,600,178 A | 2/1997 | Russell |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner et al. |
| 5,654,877 A | 8/1997 | Burns |
| 5,661,339 A | 8/1997 | Clayton |
| 5,686,730 A | 11/1997 | Laudon et al. |
| 5,688,606 A | 11/1997 | Mahulikar et al. |
| 5,708,297 A | 1/1998 | Clayton |
| 5,714,802 A | 2/1998 | Cloud et al. |
| 5,717,556 A | 2/1998 | Yanagida |
| 5,729,894 A | 3/1998 | Rostoker et al. |
| 5,731,633 A | 3/1998 | Clayton |
| 5,744,862 A | 4/1998 | Ishii |
| 5,751,553 A | 5/1998 | Clayton |
| 5,754,409 A | 5/1998 | Smith |
| 5,764,497 A | 6/1998 | Mizumo |
| 5,776,797 A | 7/1998 | Nicewarner, Jr. et al. |
| 5,789,815 A | 8/1998 | Tessier et al. |
| 5,790,447 A | 8/1998 | Laudon et al. |
| 5,802,395 A | 9/1998 | Connolly et al. |
| 5,805,422 A | 9/1998 | Otake et al. |
| 5,828,125 A | 10/1998 | Burns |
| 5,835,988 A | 11/1998 | Ishii |
| 5,869,353 A | 2/1999 | Levy et al. |
| 5,899,705 A | 5/1999 | Akram |
| 5,917,709 A | 6/1999 | Johnson et al. |
| 5,925,934 A | 7/1999 | Lim |
| 5,926,369 A | 7/1999 | Ingraham et al. |
| 5,949,657 A * | 9/1999 | Karabatsos ............... 361/803 |
| 5,953,214 A | 9/1999 | Dranchak et al. |
| 5,953,215 A | 9/1999 | Karabatsos |
| 5,959,839 A | 9/1999 | Gates |
| 5,963,427 A | 10/1999 | Bolleson |
| 5,973,395 A | 10/1999 | Suzuki et al. |
| 5,995,370 A | 11/1999 | Nakamori |
| 6,002,167 A | 12/1999 | Hatano et al. |
| 6,002,589 A * | 12/1999 | Perino et al. ............... 361/749 |
| 6,008,538 A | 12/1999 | Akram et al. |
| 6,014,316 A | 1/2000 | Eide |
| 6,021,048 A | 2/2000 | Smith |
| 6,025,992 A | 2/2000 | Dodge et al. |
| 6,028,352 A | 2/2000 | Eide |
| 6,028,365 A | 2/2000 | Akram et al. |
| 6,034,878 A | 3/2000 | Osaka et al. |

| | | | |
|---|---|---|---|
| 6,038,132 A | 3/2000 | Tokunaga et al. | |
| 6,040,624 A | 3/2000 | Chambers et al. | |
| 6,049,975 A | 4/2000 | Clayton | |
| 6,060,339 A | 5/2000 | Akram et al. | |
| 6,072,233 A | 6/2000 | Corisis et al. | |
| 6,078,515 A | 6/2000 | Nielsen et al. | |
| 6,084,294 A | 7/2000 | Tomita | |
| 6,091,145 A | 7/2000 | Clayton | |
| 6,097,087 A | 8/2000 | Farnworth et al. | |
| 6,111,757 A | 8/2000 | Dell et al. | |
| 6,121,676 A | 9/2000 | Solberg | |
| RE36,916 E | 10/2000 | Moshayedi | |
| 6,157,541 A | 12/2000 | Hacke | |
| 6,172,874 B1 | 1/2001 | Bartilson | |
| 6,178,093 B1 | 1/2001 | Bhatt et al. | |
| 6,180,881 B1 | 1/2001 | Isaak | |
| 6,187,652 B1 | 2/2001 | Chou et al. | |
| 6,205,654 B1 | 3/2001 | Burns | |
| 6,208,521 B1 | 3/2001 | Nakatsuka | |
| 6,208,546 B1 | 3/2001 | Ikeda | |
| 6,214,641 B1 | 4/2001 | Akram | |
| 6,215,181 B1 | 4/2001 | Akram et al. | |
| 6,215,687 B1 | 4/2001 | Sugano et al. | |
| 6,222,737 B1 | 4/2001 | Ross | |
| 6,222,739 B1 | 4/2001 | Bhakta et al. | |
| 6,225,688 B1 | 5/2001 | Kim et al. | |
| 6,232,659 B1 * | 5/2001 | Clayton | 257/724 |
| 6,233,650 B1 | 5/2001 | Johnson et al. | |
| 6,234,820 B1 | 5/2001 | Perino et al. | |
| 6,262,476 B1 | 7/2001 | Vidal | |
| 6,262,895 B1 | 7/2001 | Forthun | |
| 6,265,660 B1 | 7/2001 | Tandy | |
| 6,266,252 B1 | 7/2001 | Karabatsos | |
| 6,281,577 B1 | 8/2001 | Oppermann et al. | |
| 6,288,907 B1 | 9/2001 | Burns | |
| 6,288,924 B1 | 9/2001 | Sugano et al. | |
| 6,300,679 B1 | 10/2001 | Mukerji et al. | |
| 6,316,825 B1 | 11/2001 | Park et al. | |
| 6,323,060 B1 | 11/2001 | Isaak | |
| 6,336,262 B1 | 1/2002 | Dalal et al. | |
| 6,343,020 B1 | 1/2002 | Lin et al. | |
| 6,347,394 B1 | 2/2002 | Ochoa et al. | |
| 6,349,050 B1 | 2/2002 | Woo et al. | |
| 6,351,029 B1 | 2/2002 | Isaak | |
| 6,357,023 B1 | 3/2002 | Co et al. | |
| 6,358,772 B2 | 3/2002 | Miyoshi | |
| 6,360,433 B1 | 3/2002 | Ross | |
| 6,368,896 B2 | 4/2002 | Farnworth et al. | |
| 6,370,668 B1 | 4/2002 | Garrett, Jr. et al. | |
| 6,376,769 B1 | 4/2002 | Chung | |
| 6,392,162 B1 | 5/2002 | Karabatsos | |
| 6,404,043 B1 | 6/2002 | Isaak | |
| 6,410,857 B1 | 6/2002 | Gonya | |
| 6,426,240 B2 | 7/2002 | Isaak | |
| 6,426,549 B1 | 7/2002 | Isaak | |
| 6,426,560 B1 | 7/2002 | Kawamura et al. | |
| 6,428,360 B2 | 8/2002 | Hassanzadeh et al. | |
| 6,433,418 B1 | 8/2002 | Fujisawa et al. | |
| 6,444,921 B1 | 9/2002 | Wang et al. | |
| 6,446,158 B1 | 9/2002 | Karabatsos | |
| 6,449,159 B1 * | 9/2002 | Haba | 361/707 |
| 6,452,826 B1 | 9/2002 | Kim et al. | |
| 6,459,152 B1 | 10/2002 | Tomita et al. | |
| 6,462,412 B2 | 10/2002 | Kamei et al. | |
| 6,465,877 B1 | 10/2002 | Farnworth et al. | |
| 6,465,893 B1 | 10/2002 | Khandros et al. | |
| 6,472,735 B2 | 10/2002 | Isaak | |
| 6,473,308 B2 | 10/2002 | Forthun | |
| 6,486,544 B1 | 11/2002 | Hashimoto | |
| 6,489,687 B1 | 12/2002 | Hashimoto | |
| 6,502,161 B1 | 12/2002 | Perego et al. | |
| 6,514,793 B2 | 2/2003 | Isaak | |
| 6,521,984 B2 | 2/2003 | Matsuura | |
| 6,528,870 B2 | 3/2003 | Fukatsu et al. | |
| 6,531,772 B2 | 3/2003 | Akram et al. | |
| 6,544,815 B2 | 4/2003 | Isaak | |
| 6,552,910 B1 | 4/2003 | Moon et al. | |
| 6,552,948 B2 | 4/2003 | Woo et al. | |
| 6,560,117 B2 | 5/2003 | Moon | |
| 6,566,746 B2 | 5/2003 | Isaak et al. | |
| 6,572,387 B2 | 6/2003 | Burns et al. | |
| 6,573,593 B1 | 6/2003 | Syri et al. | |
| 6,576,992 B1 | 6/2003 | Cady et al. | |
| 6,588,095 B2 | 7/2003 | Pan | |
| 6,590,282 B1 | 7/2003 | Wang et al. | |
| 6,600,222 B1 | 7/2003 | Levardo | |
| 6,614,664 B2 | 9/2003 | Lee | |
| 6,627,984 B2 | 9/2003 | Bruce et al. | |
| 6,629,855 B1 | 10/2003 | North et al. | |
| 6,646,936 B2 | 11/2003 | Hamamatsu et al. | |
| 6,660,561 B2 | 12/2003 | Forthun | |
| 6,661,092 B2 | 12/2003 | Shibata et al. | |
| 6,677,670 B2 | 1/2004 | Kondo | |
| 6,683,377 B1 | 1/2004 | Shim et al. | |
| 6,690,584 B2 | 2/2004 | Uzuka et al. | |
| 6,699,730 B2 | 3/2004 | Kim et al. | |
| 6,712,226 B1 | 3/2004 | Woo et al. | |
| 6,720,652 B2 | 4/2004 | Akram et al. | |
| 6,721,181 B1 | 4/2004 | Pfeifer et al. | |
| 6,721,185 B2 | 4/2004 | Dong et al. | |
| 6,744,656 B2 | 6/2004 | Sugano et al. | |
| 6,751,113 B2 | 6/2004 | Bhakta et al. | |
| 6,756,661 B2 | 6/2004 | Tsuneda et al. | |
| 6,760,220 B2 | 7/2004 | Canter et al. | |
| 6,762,942 B1 * | 7/2004 | Smith | 361/749 |
| 6,768,660 B2 | 7/2004 | Kong et al. | |
| 6,833,981 B2 | 12/2004 | Suwabe et al. | |
| 6,833,984 B1 | 12/2004 | Belgacem | |
| 6,839,266 B1 | 1/2005 | Garrett, Jr. et al. | |
| 6,841,868 B2 | 1/2005 | Akram et al. | |
| 6,850,414 B2 | 2/2005 | Benisek et al. | |
| 6,873,534 B2 | 3/2005 | Bhakta et al. | |
| 6,878,571 B2 | 4/2005 | Isaak et al. | |
| 6,884,653 B2 | 4/2005 | Larson | |
| 6,914,324 B2 | 7/2005 | Rapport et al. | |
| 6,919,626 B2 | 7/2005 | Burns | |
| 6,956,284 B2 | 10/2005 | Cady et al. | |
| 7,053,478 B2 | 5/2006 | Roper et al. | |
| 7,094,632 B2 | 8/2006 | Cady et al. | |
| 7,180,167 B2 | 2/2007 | Partridge et al. | |
| 7,393,226 B2 | 7/2008 | Clayton | |
| 7,394,149 B2 | 7/2008 | Clayton | |
| 2001/0001085 A1 | 5/2001 | Hassanzadeh et al. | |
| 2001/0006252 A1 | 7/2001 | Kim et al. | |
| 2001/0013423 A1 | 8/2001 | Dalal et al. | |
| 2001/0015487 A1 | 8/2001 | Forthun | |
| 2001/0026009 A1 | 10/2001 | Tsunesa et al. | |
| 2001/0028588 A1 | 10/2001 | Yamada et al. | |
| 2001/0035572 A1 | 11/2001 | Isaak | |
| 2001/0040793 A1 | 11/2001 | Inaba | |
| 2001/0052637 A1 | 12/2001 | Akram et al. | |
| 2002/0001216 A1 | 1/2002 | Sugano et al. | |
| 2002/0006032 A1 | 1/2002 | Karabatsos | |
| 2002/0030995 A1 | 3/2002 | Shoji | |
| 2002/0076919 A1 | 6/2002 | Peters et al. | |
| 2002/0094603 A1 | 7/2002 | Isaak | |
| 2002/0101261 A1 | 8/2002 | Karabatsos | |
| 2002/0139577 A1 | 10/2002 | Miller | |
| 2002/0164838 A1 | 11/2002 | Moon et al. | |
| 2002/0180022 A1 | 12/2002 | Emoto | |
| 2002/0185731 A1 | 12/2002 | Akram et al. | |
| 2002/0196612 A1 | 12/2002 | Gall et al. | |
| 2003/0002262 A1 | 1/2003 | Benisek et al. | |
| 2003/0026155 A1 | 2/2003 | Yamagata | |
| 2003/0035328 A1 | 2/2003 | Hamamatsu et al. | |
| 2003/0045025 A1 | 3/2003 | Coyle et al. | |

| | | | |
|---|---|---|---|
| 2003/0049886 A1 | 3/2003 | Salmon | |
| 2003/0064548 A1 | 4/2003 | Isaak | |
| 2003/0081387 A1 | 5/2003 | Schulz | |
| 2003/0081392 A1 | 5/2003 | Cady et al. | |
| 2003/0089978 A1 | 5/2003 | Miyamoto et al. | |
| 2003/0090879 A1 | 5/2003 | Doblar et al. | |
| 2003/0096497 A1 | 5/2003 | Moore et al. | |
| 2003/0109078 A1 | 6/2003 | Takahashi et al. | |
| 2003/0116835 A1* | 6/2003 | Miyamoto et al. | 257/678 |
| 2003/0159278 A1 | 8/2003 | Peddle | |
| 2003/0168725 A1 | 9/2003 | Warner et al. | |
| 2004/0000708 A1 | 1/2004 | Rapport et al. | |
| 2004/0012991 A1 | 1/2004 | Kozaru | |
| 2004/0021211 A1 | 2/2004 | Damberg | |
| 2004/0099938 A1 | 5/2004 | Kang et al. | |
| 2004/0150107 A1 | 8/2004 | Cha et al. | |
| 2004/0229402 A1 | 11/2004 | Cady et al. | |
| 2004/0236877 A1 | 11/2004 | Burton | |
| 2005/0082663 A1 | 4/2005 | Wakiyama et al. | |
| 2005/0108468 A1 | 5/2005 | Hazelzet et al. | |
| 2005/0133897 A1 | 6/2005 | Baek et al. | |
| 2005/0242423 A1 | 11/2005 | Partridge et al. | |
| 2005/0263911 A1 | 12/2005 | Igarashi et al. | |
| 2006/0020740 A1 | 1/2006 | Bartley et al. | |
| 2006/0050496 A1 | 3/2006 | Goodwin | |
| 2006/0050497 A1 | 3/2006 | Goodwin | |
| 2006/0053345 A1 | 3/2006 | Goodwin | |
| 2006/0091529 A1 | 5/2006 | Wehrly et al. | |
| 2006/0095592 A1 | 5/2006 | Borkenhagen | |
| 2006/0111866 A1 | 5/2006 | LeClerg et al. | |
| 2006/0125067 A1 | 6/2006 | Wehrly et al. | |
| 2007/0211426 A1 | 9/2007 | Clayton | |
| 2007/0211711 A1 | 9/2007 | Clayton | |
| 2007/0212906 A1 | 9/2007 | Clayton | |
| 2007/0212920 A1 | 9/2007 | Clayton | |
| 2008/0030966 A1 | 2/2008 | Goodwin | |
| 2008/0030972 A1 | 2/2008 | Goodwin | |
| 2008/0192428 A1 | 8/2008 | Clayton | |

FOREIGN PATENT DOCUMENTS

| | | |
|---|---|---|
| EP | 0 298 211 A3 | 1/1989 |
| EP | 0527044 | 6/1996 |
| EP | 1 119049 A2 | 7/2001 |
| GB | 2 130 025 A | 5/1984 |
| JP | 53-85159 | 7/1978 |
| JP | 58-96756 (A) | 6/1983 |
| JP | 63-114195 | 3/1990 |
| JP | 3-102862 | 4/1991 |
| JP | 5-29534 (A) | 2/1993 |
| JP | 5-335695 (A) | 12/1993 |
| JP | 2821315 (B2) | 11/1998 |
| JP | 11003955 A | 1/1999 |
| JP | 2000/031614 | 1/2000 |
| JP | 2001/077294 (A) | 3/2001 |
| JP | 2001/085592 (A) | 3/2001 |
| JP | 2001/168268 | 6/2001 |
| JP | 2001/332683 (A) | 11/2001 |
| JP | 2002/009231 (A) | 1/2002 |
| JP | 2002/359448 | 12/2002 |
| JP | 04-234157 | 1/2003 |
| JP | 2003/031757 | 1/2003 |
| JP | 2003/037246 (A) | 2/2003 |
| JP | 2003/086760 (A) | 3/2003 |
| JP | 2003/086761 (A) | 3/2003 |
| JP | 2003/309246 (A) | 10/2003 |
| JP | 2003/347503 (A) | 12/2003 |
| WO | WO03/037053 | 5/2003 |
| WO | WO 03/037053 A1 | 5/2003 |
| WO | WO 2004/109802 A1 | 12/2004 |

OTHER PUBLICATIONS

Letter dated Sep. 11, 2006, from Chris Karabatsos of Kentron Technologies to John Kelly, President of JEDEC Solid State Technology Association, concerning potential interferences involving U.S. Appl. No. 11/306,803.
U.S. Appl. No. 11/306,803, filed Jan. 11, 2006, Chris Karabatsos.
PCT/US06/06921 International Search Report and Written Opinion, PCT, Jun. 1, 2007.
PCT/US05/28547 International Search Report and Written Opinion, PCT, Aug. 18, 2006.
PCT/US05/28547 Notification Concerning Transmittal of International Preliminary Report on Patentability, Mar. 15, 2007.
GB 0516622.8 Search Report, May 25, 2006.
PCT/US06/04690 International Search Report, PCT, Feb. 16, 2007.
PCT/US06/38720 International Search Report and Written Opinion, PCT, Apr. 5, 2007.
Pages 19-22 of Presentation by Netlist, Aug. 2004.
Flexible Printed Circuit Technology—A Versatile Interconnection Option. (Website 2 pages) Fjelstad, Joseph. Dec. 3, 2002.
Die Products; Ideal IC Packaging for Demanding Applications—Advanced packaging that's no bigger than the die itself brings together high performance and high reliability with small size and low cost. (Website 3 pages with 2 figures) Larry Gilg and Chris Windsor, Dec. 23, 2002. Published on Internet.
Chip Scale Review Online—An Independent Journal Dedicated to the Advancement of Chip-Scale Electronics. (Website 9 pages) Fjelstad, Joseph, Pacific Consultants L.L.C., Published Jan. 2001 on Internet.
Flexible Thinking: Examining the Flexible Circuit Tapes. (Website 2 pages) Fjelstad, Joseph., Published Apr. 20, 2000 on Internet.
Ron Bauer, Intel, "Stacked-CSP Delivers Flexibility, Reliability, and Space-Saving Capabilities", vol. 3, Spring 2002. Published on the Internet.
Tessers Introduces uZ a—Ball Stacked Memory Package for Computing and Portable Electronic Products Joyce Smaragdis, Tessera Public Relations, Sandy Skees, MCA PR (www.tessera.com/news_events/press_coverage.cfm); 2 figures that purport to be directed to the uZ a—Ball Stacked Memory Package. Published Jul. 17, 2002 in San Jose, CA.
Dense-Pac Microsystems, Breaking Space Barriers, 3-D Technology 1993.
PCT/US2006/007193, International Search Report and Written Opinion of the International Searching Authority, PCT, Nov. 7, 2007.
GB 0822086.5 Search Report, Jan. 14, 2009.
GB 0516622.8 Search Report, Dec. 31, 2005.
JP 2005-235451 Search Report, Nov. 18, 2008.

* cited by examiner

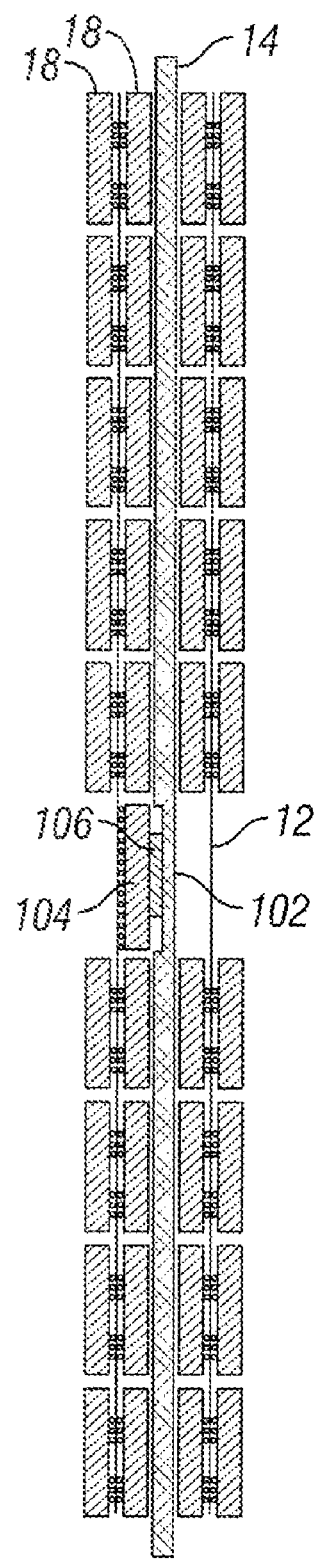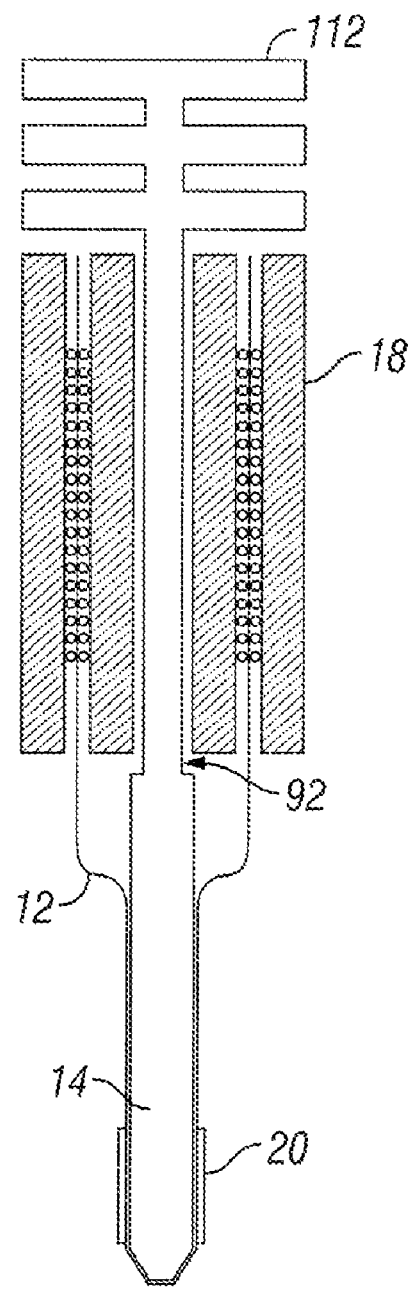
FIG. 10                    FIG. 11

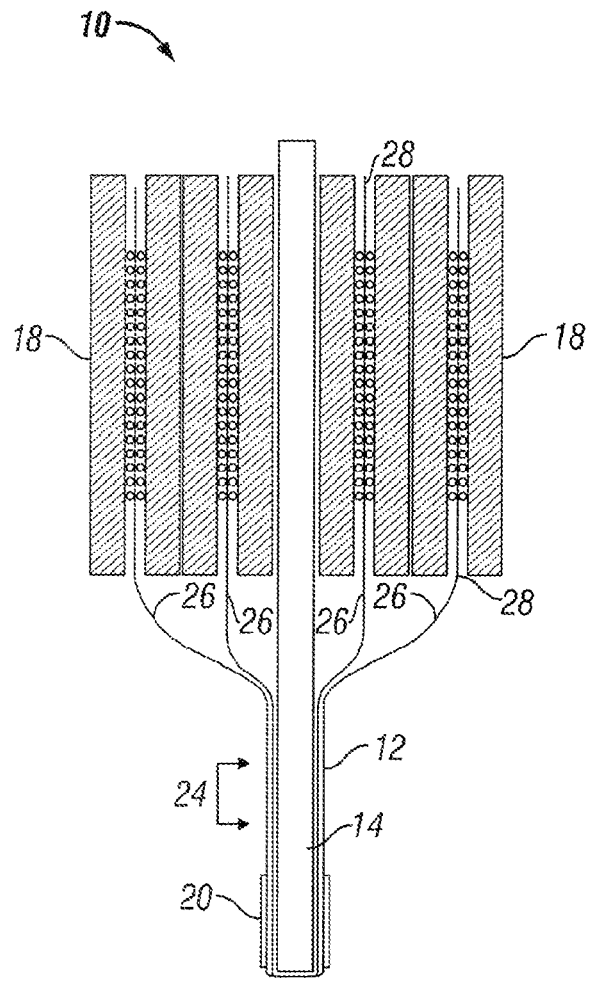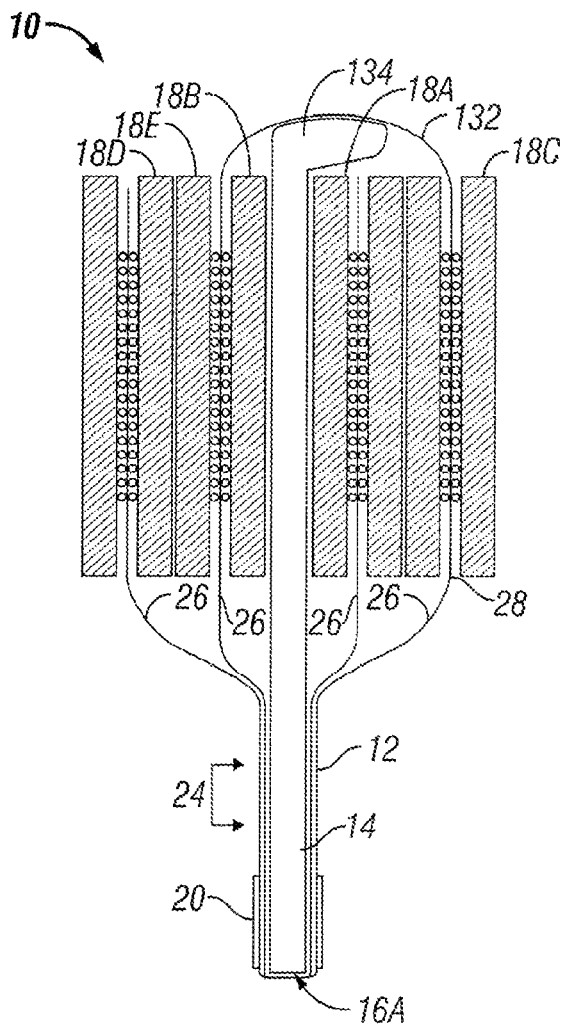
*FIG. 12*  *FIG. 13*

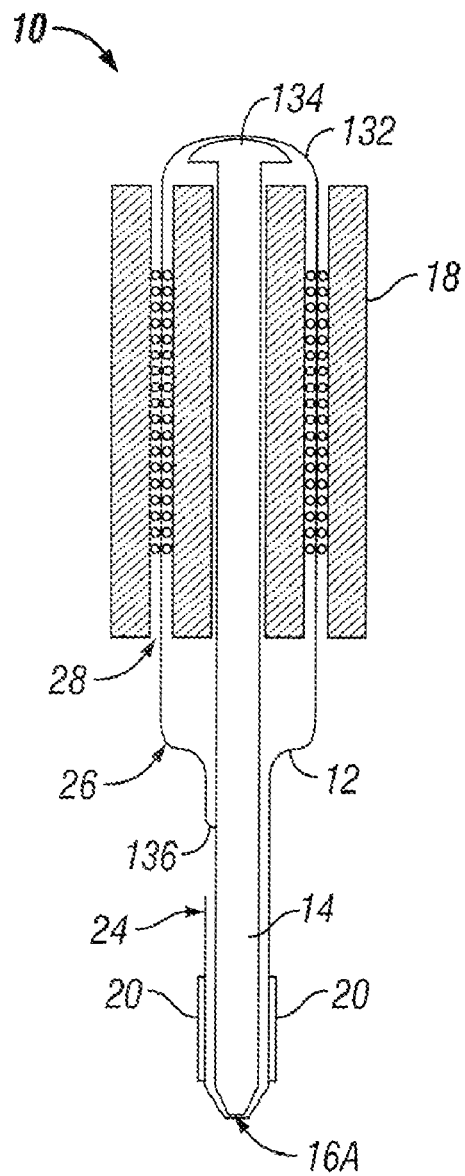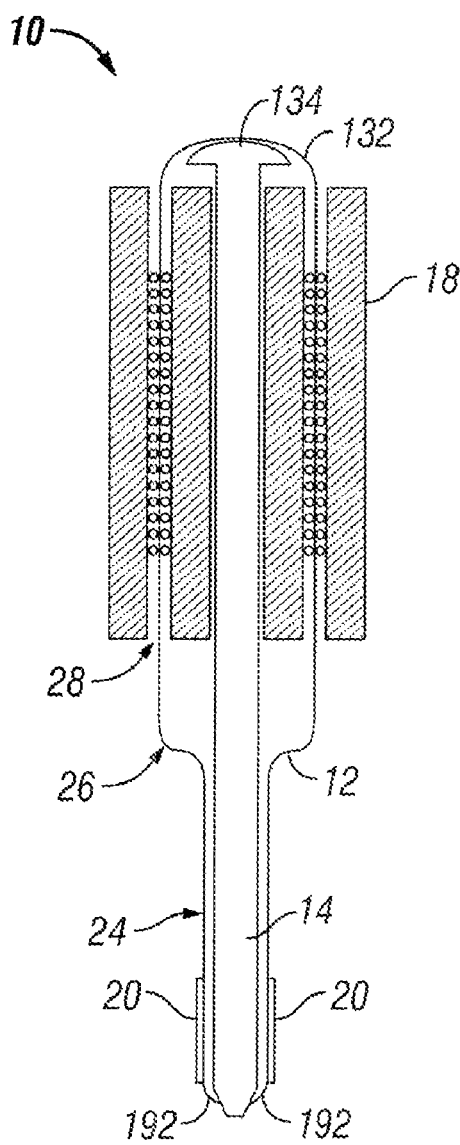
FIG. 14
FIG. 15

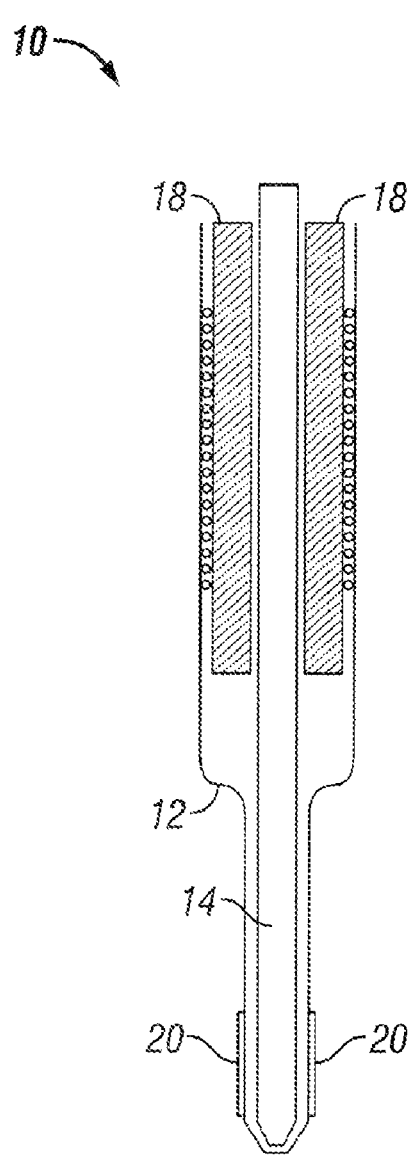
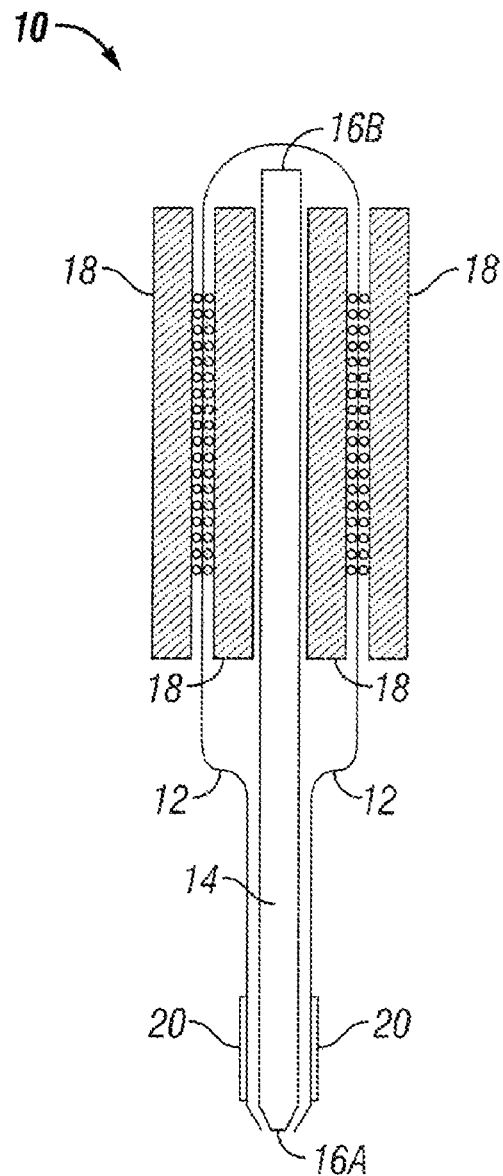
*FIG. 18*          *FIG. 19*

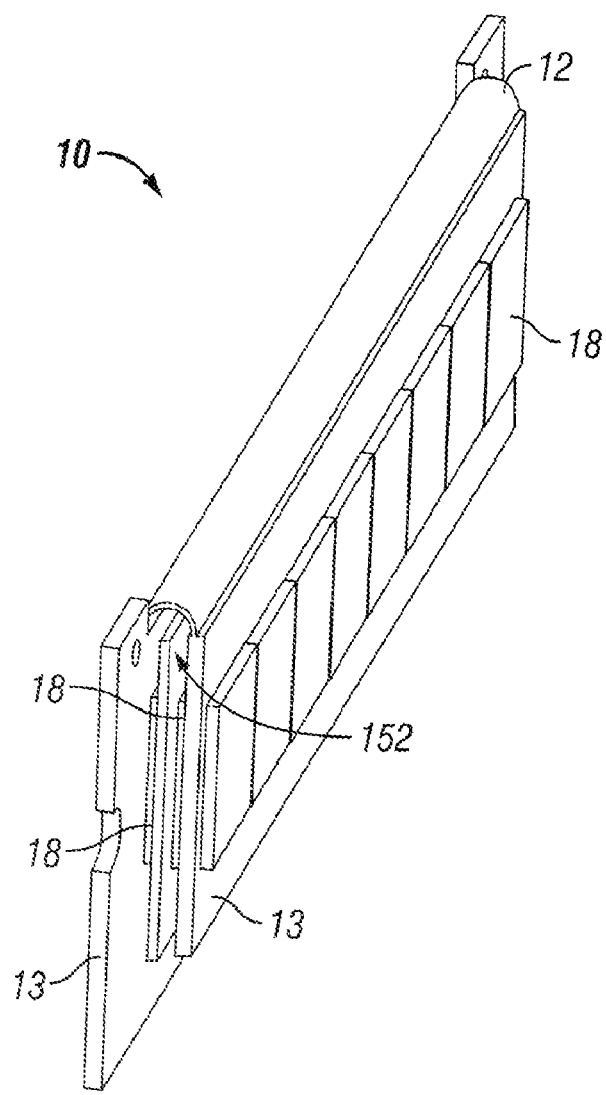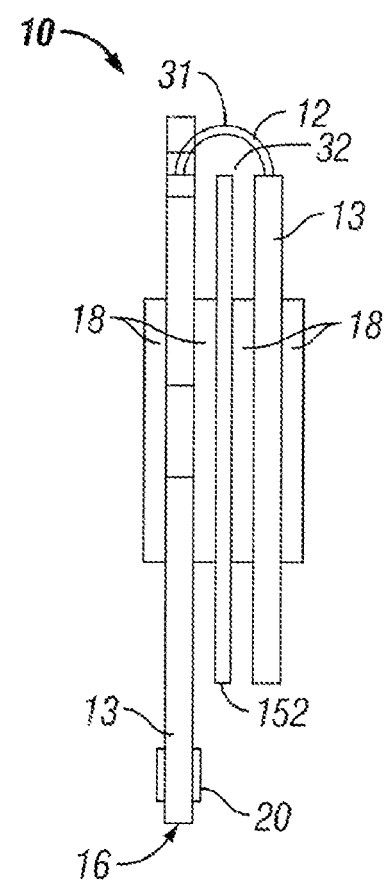
*FIG. 23*     *FIG. 24*

THIN MODULE SYSTEM AND METHOD

CROSS REFERENCE TO RELATED APPLICATIONS

This application is a divisional of U.S. patent application Ser. No. 10/934,027 filed Sep. 3, 2004, pending, which is hereby incorporated by reference.

FIELD

The present invention relates to systems and methods for creating high density circuit modules.

BACKGROUND

A variety of techniques are used to make high density circuit modules. Some techniques require special circuit board designs, while other techniques use conventional circuit boards.

Memory expansion is one of the many fields in which high density circuit board solutions provide space-saving advantages. For example, the well-known DIMM (Dual In-line Memory Module) board has been used for years, in various forms, to provide memory expansion. A typical DIMM includes a conventional PCB (Printed Circuit Board) with memory devices and supporting digital logic devices mounted on both sides. The DIMM is typically mounted in the host computer system by inserting a contact-bearing edge of the DIMM into a card edge connector. Typically, systems that employ DIMMs provide limited space for such devices and most memory expansion boards are somewhat limited in the memory capacity they add to a system.

There are several known methods to improve the limited capacity of a DIMM or other circuit board. Such methods have various cost or performance impacts. Further, many capacity increasing techniques exacerbate profile issues and contribute to thermal management complexities.

In one scheme, small circuit boards (daughter cards) are connected to the DIMM to provide extra mounting space, The additional connection may cause however, flawed signal integrity for the data signals passing from the DIMM to the daughter card. For example, signal traces between devices on the DIMM and devices on the daughter card may at higher speeds add to signal dispersion while added connectors are a considerable reliability issue. Other problems may arise from the connector that attaches the daughter card to the DIMM. Such flaws may cause reflections and compromise the quality of signaling waveforms and reduce the maximum speed at which the devices may operate.

Another scheme to increase circuit board capacity is multiple die packages (MDP). This scheme increases the capacity of the memory devices on the DIMM by including multiple semiconductor die in a single device package. The additional heat generated by the multiple die typically requires, however, additional cooling capabilities to operate at maximum operating speed. Further, the MDP scheme may exhibit increased costs because of increased yield loss from packaging together multiple die that are not fully pre-tested.

Yet another strategy to increase circuit board capacity is stacked packages. This scheme increases capacity by stacking packaged integrated circuits to create a high-density circuit module for mounting on the circuit board. In some techniques, flexible conductors are used to selectively interconnect packaged integrated circuits. Staktek Group L.P. has developed numerous systems for aggregating CSP (chip-scale packaged) devices in space saving topologies. The increased component height of some stacking techniques may alter, however, system requirements such as, for example, required cooling airflow or the minimum spacing around a circuit board on its host system.

Typically, the known methods raise thermal management issues. For example, when a conventional FBGA packaged DRAM is mounted on a DIMM, the primary thermal path is through the balls into the core of a multilayer DIMM. When, for example, a stack of devices is employed on a DIMM, the top device gets hotter when it is active versus when the lower device is active, thus stacking methods in DIMM applications may present thermal constraints.

What is needed therefore are methods and structures for providing high capacity circuit boards in thermally efficient, reliable designs that perform well at higher frequencies but are not too large, yet can be made at reasonable cost with commonly available and readily managed materials.

SUMMARY

A flexible circuit has contacts for mounting in a socket or card edge connector. Preferred embodiments of the present invention can be used to provide an increased surface area circuit board module.

In one preferred embodiments a flexible circuit is populated on both sides with integrated circuits and wrapped about an edge of a rigid substrate. The flexible circuit presents contacts for mounting the assembly in a socket. Multiple flex circuits may be overlaid with the same scheme. The flex circuit may aligned using tooling holes in the flex circuit and substrate. The flexible circuit may exhibit one or two or more conductive layers, and may have changes in the layered structure or have split layers.

In another preferred embodiment, the invention provides a method of assembling a circuit module including mounting ICs on both sides of a flexible circuit having contacts, providing a rigid substrate, and wrapping the flexible circuit around the substrate to present contacts near the edge of the substrate for insertion into an expansion board slot.

BRIEF DESCRIPTION OF THE DRAWINGS

FIG. 10 is a cross-sectional view of another preferred embodiment of the present invention.

FIG. 11 depicts another preferred embodiment having an extended substrate.

FIG. 12 depicts alternate preferred embodiment having additional layers of ICs.

FIG. 13 depicts another embodiment having flex portions wrapped around opposing edges of a substrate.

FIG. 14 depicts yet another embodiment having a flex portion wrapped around opposing edges of a substrate.

FIG. 15 is a cross-sectional view of another embodiment of the present invention.

FIG. 18 depicts an alternative embodiment of the present invention having CSPs mounted between a flex circuit and substrate.

FIG. 19 depicts an alternative embodiment of the present invention in which the flex circuit transits over an end of the substrate opposite the edge connector contacts.

FIG. 23 is an elevation view of an embodiment of an alternative circuit module.

FIG. 24 is a cross-sectional view of the embodiment of FIG. 23.

DETAILED DESCRIPTION OF PREFERRED EMBODIMENTS

Figure 1:
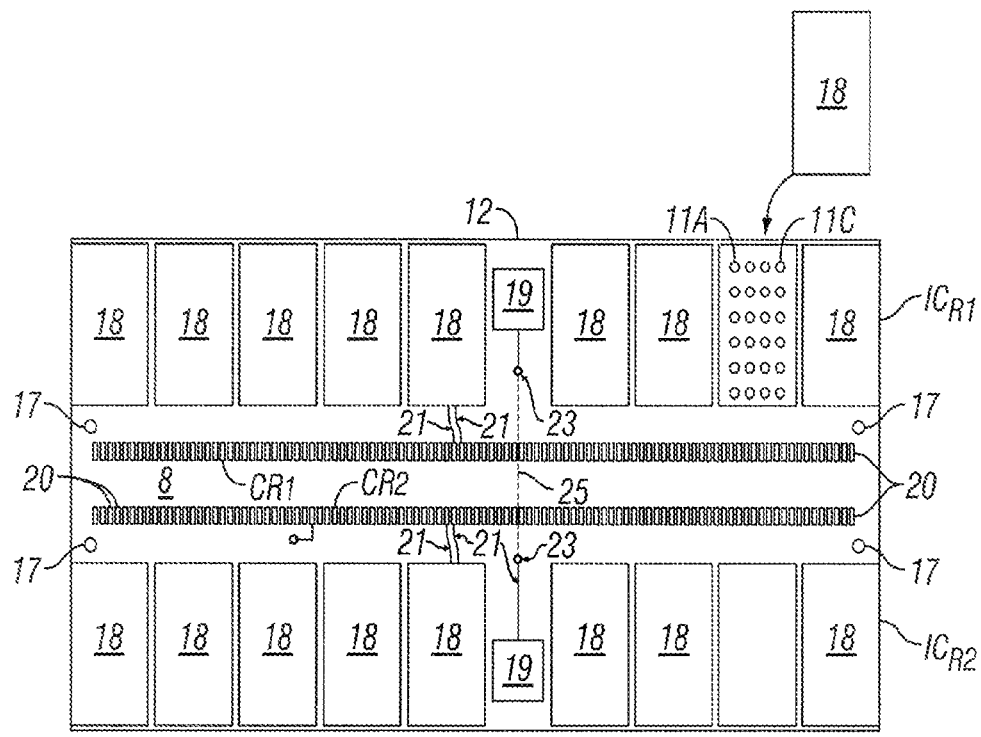
FIG. 1 depicts a contact-bearing first side of a flex circuit devised in accordance with a preferred embodiment of the present invention.
Figure 2:
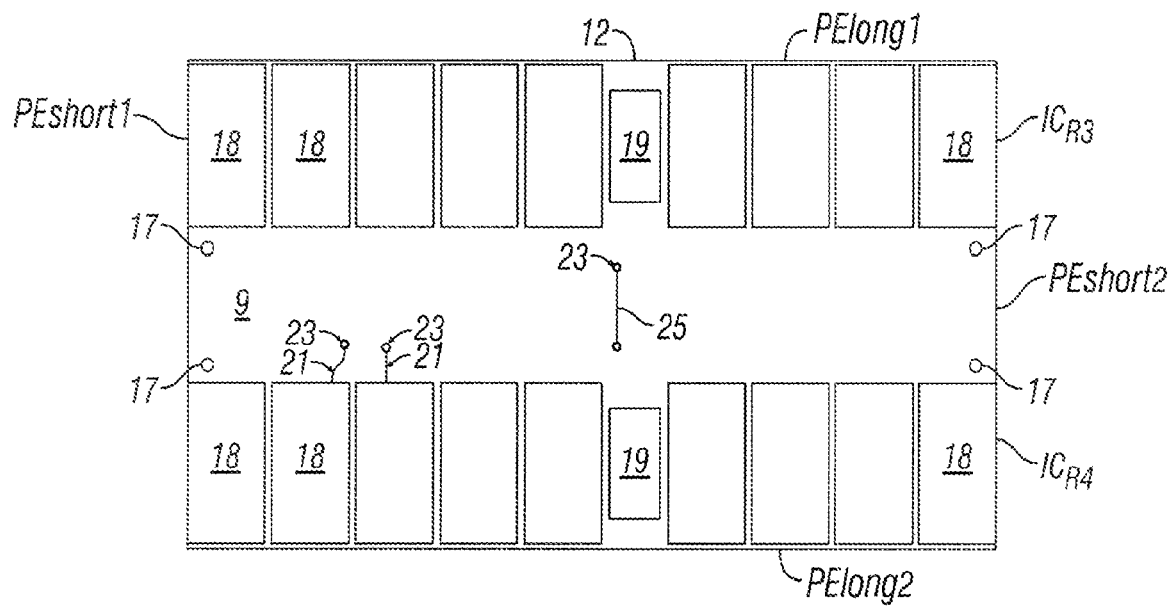
FIG. 2 depicts the second side of the flex circuit of FIG. 1.

FIGS. 1 and 2 depict opposing sides 8 and 9 of a preferred flex circuit 12 ("flex", "flex circuitry", "flexible circuit") used in constructing a preferred embodiment of the present invention. Flex circuit 12 is preferably made from conductive layers supported by one or more flexible substrate layers as further described with reference to later Figures. The construction of flex circuitry is known in the art. The entirety of the flex circuit 12 may be flexible or, as those of skill in the art will recognize, the flexible circuit structure 12 may be made flexible in certain areas to allow conformability to required shapes or bends, and rigid in other areas to provide rigid and planar mounting surfaces. Preferred flex circuit 12 has openings 17 for use in aligning flex circuit 12 to substrate 14 during assembly.

ICs 18 on flexible circuit 12 are, in this embodiment, chip-scale packaged memory devices. For purposes of this disclosure, the term chip-scale or "CSP" shall refer to integrated circuitry of any function with an array package providing connection to one or more die through contacts (often embodied as "bumps" or "balls" for example) distributed across a major surface of the package or die. CSP does not refer to leaded devices that provide connection to an integrated circuit within the package through leads emergent from at least one side of the periphery of the package such as, for example, a TSOP.

Embodiments of the present invention may be employed with leaded or CSP devices or other devices in both packaged and unpackaged forms but where the term CSP is used, the above definition for CSP should be adopted. Consequently, although CSP excludes leaded devices, references to CSP are to be broadly construed to include the large variety of array devices (and not to be limited to memory only) and whether die-sized or other size such as BGA and micro BGA as well as flip-chip. As those of skill will understand after appreciating this disclosure, some embodiments of the present invention may be devised to employ stacks of ICs each disposed where an IC 18 is indicated in the exemplar FIGS.

Multiple integrated circuit die may be included in a package depicted a single IC 18. While in this embodiment memory ICs are used to provide a memory expansion board, this is not limiting and various embodiments may include a variety of integrated circuits and other components. Such variety may include microprocessors, FPGA's, RF transceiver circuitry, digital logic, as a list of non-limiting examples, or other circuits or systems which may benefit from a high-density circuit board capability. Circuit 19 depicted between a pair of ICs 18 may be a memory buffer or controller.

FIG. 1 depicts a top or outer side 8 of flex circuit 12 having ICs 18 mounted in two rows $IC_{R1}$ and $IC_{R2}$. Contact arrays are disposed beneath ICs 18 and circuit 19 to provide conductive pads for interconnection to the ICs. An exemplar contact array 11A is shown as is exemplar IC 18 to be mounted at contact array 11A as depicted. The contact arrays 11A that correspond to an IC row (e.g., $IC_{R1}$) may be considered a contact array set. Between the rows $IC_{R1}$ and $IC_{R2}$ of ICs 18, flex circuit 12 has two rows ($C_{R1}$ and $C_{R2}$) of module contacts 20. When flex circuit 12 is folded as depicted in later FIGS. 3 and 4, side 8 depicted in FIG. 1 is presented at the outside of module 10. The opposing side 9 of flex circuit 12 (FIG. 2) is on the inside in the folded configurations of FIGS. 3 and 4. The depiction of FIG. 1 shows two pluralities of ICs 18 along side 8 of flex circuit 12, the pluralities or sets of ICs being referenced in FIG. 1 as $IC_{R1}$ and $IC_{R2}$. Other embodiments may have other numbers of rows and there may be only one such row. FIG. 2 depicts another two pluralities of ICs 18 along side 9 of flex circuit 12 referenced as $IC_{R3}$ and $IC_{R4}$. Various discrete components such as termination resistors, bypass capacitors, and bias resistors may also be mounted on each of sides 8 and 9 of flex 12. Such discrete components are not shown to simplify the drawing. Flex circuit 12 may also depicted with reference to its perimeter edges, two of which are typically long ($PE_{long1}$ and $PE_{long2}$) and two of which are typically shorter ($PE_{short1}$ and $PE_{short2}$) Other embodiments may employ flex circuits 12 that are not rectangular in shape and may be square in which case the perimeter edges would be of equal size or other convenient shape to adapt to manufacturing particulars. However, rectangular shapes for flex circuit 12 assist in providing a low profile for a preferred module devised with use of flex circuit 12.

FIG. 1 depicts exemplar conductive traces 21 connecting rows $C_{R1}$ and $C_{R2}$ of module contacts 20 to ICs 18. Only a few exemplar traces are shown to simplify the drawing. Traces 21 may also connect to vias that may transit to other conductive layers of flex 12 in certain embodiments having more than one conductive layer. Shown is a via 23 connecting a signal trace 23 from circuit 19 to a trace 25 disposed on another conductive layer of flex 12 as illustrated by the dotted line of trace 25. In a preferred embodiment, vias connect ICs 18 on side 9 of flex 12 (FIG. 2) to module contacts 20. Traces 21 and 25 may make other connections between the ICs on either side of flex 12 and may traverse the rows of module contacts 20 to interconnect ICs. Together the various traces and vias make interconnections needed to convey data and control signals to the various ICs. Those of skill will understand that the present invention may be implemented with only a single row of module contacts 20 and may, in other embodiments be implemented as a module bearing ICs on only one side.

Figure 3:
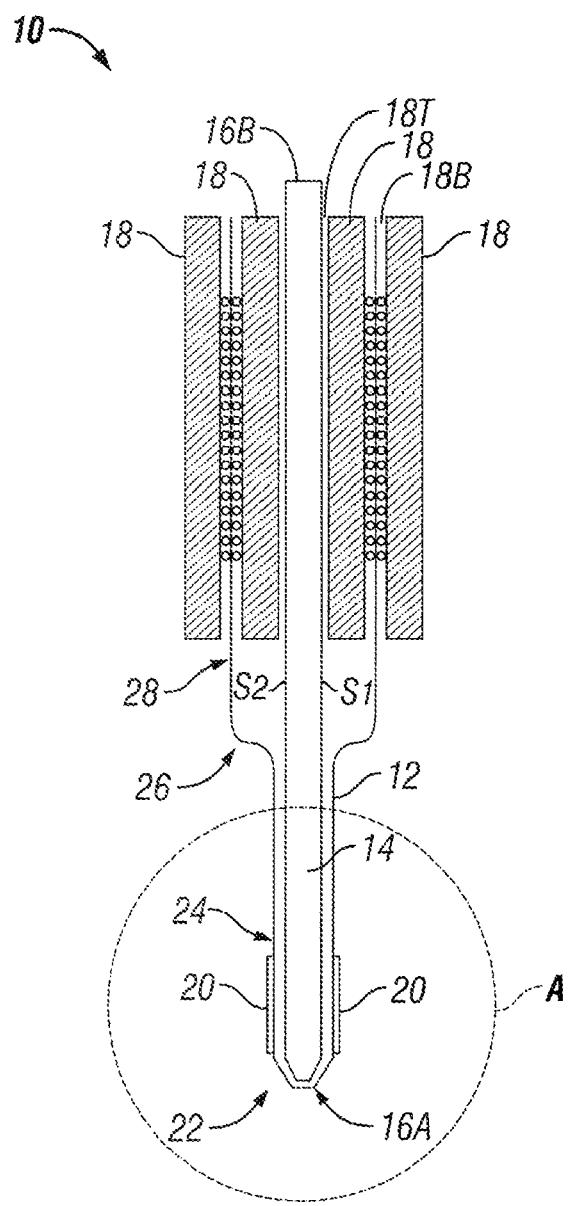
FIG. 3 depicts a cross-sectional view of a module assembly devised in accordance with a preferred embodiment of the present invention.
Figure 6:
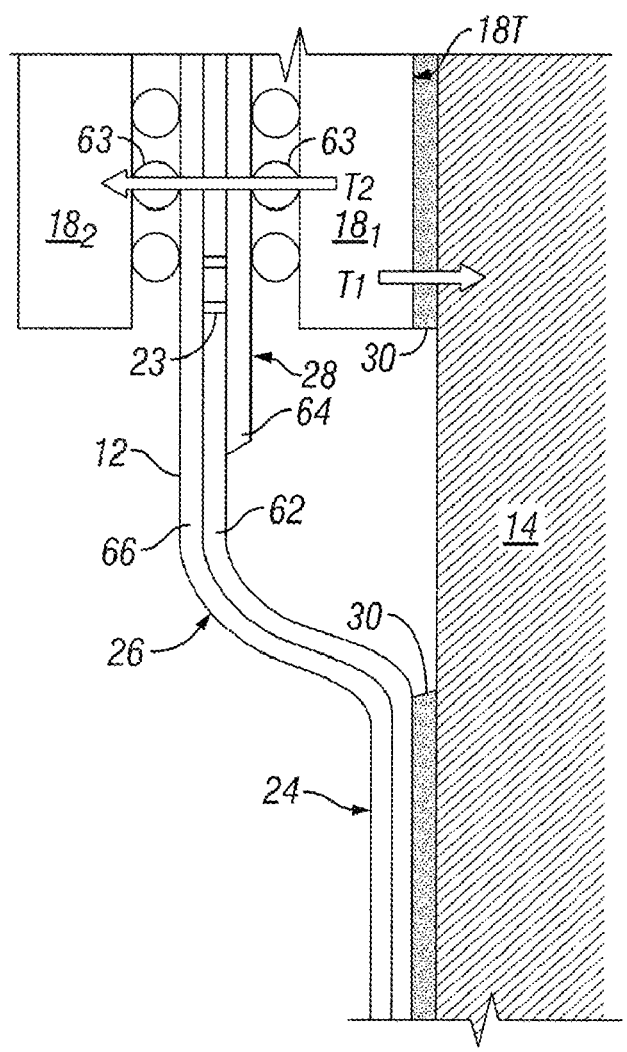
FIG. 6 is an enlarged view of a portion of one preferred embodiment.

FIG. 3 is a cross section view of a module assembly 10 devised in accordance with a preferred embodiment of the present invention. Module assembly 10 is populated with ICs 18 having top surfaces $18_T$ and bottom surfaces $18_B$. Substrate 14 has a first and a second perimeter edges 16A and 16B appearing in the depiction of FIG. 3 as ends. Substrate 14 typically has first and second lateral sides $S_1$ and $S_2$. Flex 12 is wrapped about perimeter edge 16A of substrate 14, which in the depicted embodiment, provides the basic shape of a common DIMM board form factor such as that defined by JEDEC standard MO-256. Preferably, at least a portion 24 of the pocket of flex 12 formed by the wrapping about the substrate is laminated or otherwise connected to substrate 14 on both sides of substrate 14. Portion 24 may vary in length depending on factors such as, for example, the height of ICs 18, the thickness of substrate 14, the length of module contacts 20, and the size and design of the card edge connector or socket into which module assembly 10 is adapted to be mounted. Above portion 24 is depicted flex level transition 26 of flex circuit 12. The space between flex level transition 26 and substrate 14 may be filled with a conformal or heat conductive underfill, or may be left unfilled. Flex level transition 26 is a bend formed in a manner devised to allow flex circuit 12 to provide conductive connection from a plane at the level of flex circuit portion 24 to a plane at the level of flex circuit portion 28. The offset between the two planes is, in this embodiment, the height of a single IC 18 added to that of adhesive 30 (FIG. 6). Adhesive 30 in a preferred embodiment is a thermally conductive material to take advantage of the heat dissipation characteristics that may be provided by use of an appropriately selected substrate 14 comprised, for example, of a metal such as aluminum.

The inner pair of the four depicted ICs 18 are preferably attached to substrate 14 with a heat conductive adhesive 30. While in this embodiment, the four depicted ICs are attached to flex circuit 12 in opposing pairs, this is not limiting and more ICs may be connected in other arrangements such as, for example, staggered or offset arrangements. Further, while only CSP packaged ICs are shown, other ICs and components may be attached. In a preferred embodiment, ICs 18 will be memory CSPs and various discrete components such as, for example, resistors and capacitors will also be mounted on flex circuit portion 28. To simplify the drawing, the discrete components are not shown. Further, ICs and other components may be mounted to flex circuit portion 24.

In this embodiment, flex circuit 12 has module contacts 20 positioned in a manner devised to fit in a circuit board card edge connector or socket and connect to corresponding contacts in the connector (not shown). While module contacts 20 are shown protruding from the surface of flex circuit 12, this is not limiting and other embodiments may have flush contacts or contacts below the surface level of flex 12. Substrate 14 supports module contacts 20 from behind flex circuit 12 in a manner devised to provide the mechanical form required for insertion into a socket. While the depicted substrate 14 has uniform thickness, this is not limiting and in other embodiments the thickness or surface of substrate 14 in the vicinity of perimeter edge 16A may differ from that in the vicinity of perimeter edge 16B. Non-limiting examples of such possible variations are found in FIGS. 9 and 10. Substrate 14 in the depicted embodiment is preferably made of a metal such as aluminum or copper, as non-limiting examples, or where thermal management is less of an issue, materials such as FR4 (flame retardant type 4) epoxy laminate, PTFE (poly-tetra-fluoro-ethylene) or plastic. In another embodiment, advantageous features from multiple technologies may be combined with use of FR4 having a layer of copper on both sides to provide a substrate 14 devised from familiar materials which may provide heat conduction or a ground plane.

One advantageous methodology for efficiently assembling a circuit module 10 such as described and depicted herein is as follows. In a preferred method of assembling a preferred module assembly 10, flex circuit 12 is placed flat and both sides populated according to circuit board assembly techniques known in the art. Flex circuit 12 is then folded about end 16A of substrate 14. Next, tooling holes 17 may be used to align flex 12 to substrate 14. Flex 12 may be laminated or otherwise attached to substrate 14 at portions 24. Further, top surfaces $18_T$ of ICs 18 may be attached to substrate 14 in a manner devised to provide mechanical integrity or thermal conduction.

Figure 4:
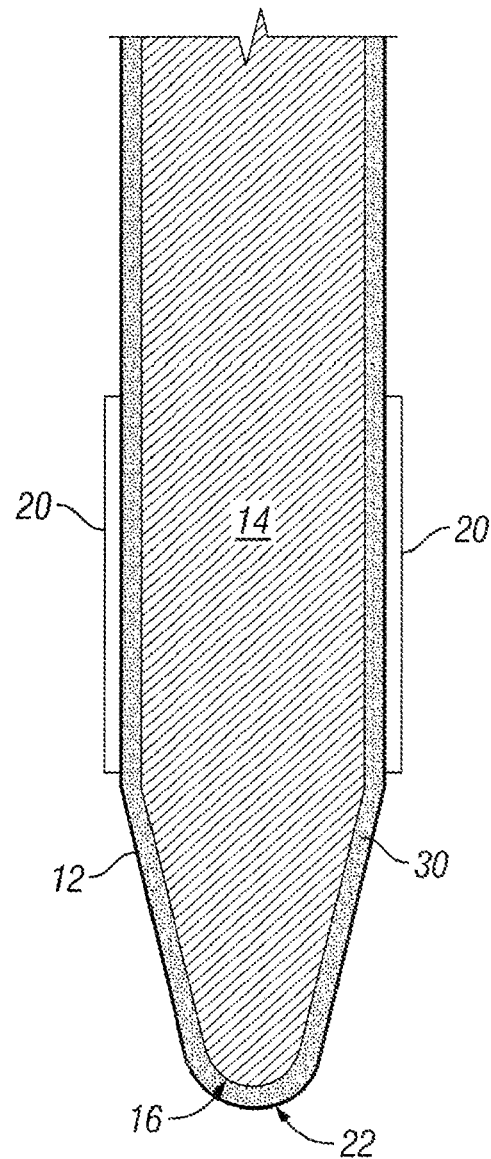
FIG. 4 is an enlarged view of the area marked "A" in FIG. 3.

FIG. 4 is an enlarged view of the area marked 'A' in FIG. 3. Edge 16A of substrate 14 is shaped like a male side edge of an edge card connector. While a particular oval-like configuration is shown, edge 16A may take on other shapes devised to mate with various connectors or sockets. The form and function of various edge card connectors are well know in the art. Flex 12 is wrapped around edge 16A of substrate 14 and may be laminated or adhesively connected to substrate 14 with adhesive 30. The depicted adhesive 30 and flex 12 may vary in thickness and are not drawn to scale to simplify the drawing. The depicted substrate 14 has a thickness such that when assembled with the flex 12 and adhesive 30 the thickness measured between module contacts 20 falls in the range specified for the mating connector. In some other embodiments, flex circuit 12 may be wrapped about perimeter edge 16B or both perimeter edges 16A and 16B of substrate 14.

Figure 5:
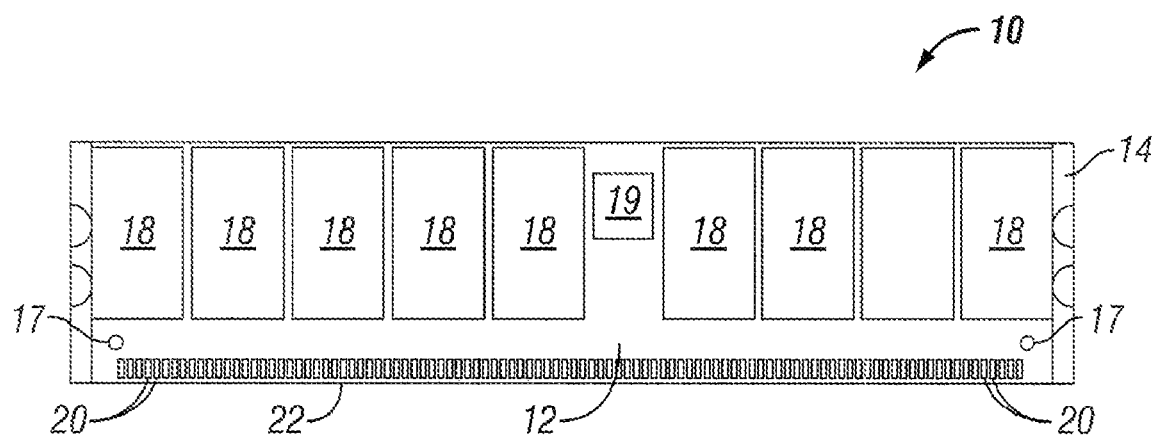
FIG. 5 is a plan view depicting one side of a module assembly devised in accordance with a preferred embodiment of the present invention.

FIG. 5 depicts a plan view of module assembly 10 devised in accordance with a preferred embodiment of the present invention. Those of skill will recognize that module assembly 10 may replace more traditional DIMMs employed in a large variety of systems. Module assembly 10 has flex circuit 12 wrapped about an edge 16 of substrate 14. ICs 18 are mounted to flex circuit 12 along the depicted side as described with reference to earlier FIGS. Module contacts 20 are presented near edge 22 of module assembly 10 for connection to a card edge connector or socket.

FIG. 6 is an enlarged view of a portion of one preferred embodiment showing lower IC $18_1$ and upper IC $18_2$. Flex 12 has flex level transition 26 bending from flex circuit portion 24 to flex circuit portion 28. Flex level transition 26 has, in this embodiment, a flexible base layer 62 and a conductive layer 66. In this embodiment, conductive layer 66 contains conductive traces connecting module contacts 20 on flex portion 24 to BGA contacts 63 on ICs $18_1$ and $18_2$. Flex portion 24 has two layers, but this is not limiting and other embodiments may have other numbers of layers. The number of layers may be devised in a manner to achieve the bend radius required to bend around edge 16A (FIG. 4) or 16B, for example. The number of layers in any particular portion of flex circuit 12 may also be devised to achieve the necessary connection density given a particular minimum trace width associated with the flex circuit technology used.

In this embodiment, there are three layers at flex portion 28 between the two depicted ICs $18_1$ and $18_2$. Conductive layers 64 and 66 express conductive traces that connect to the ICs and may further connect to other discrete components (not shown). Preferably, the conductive layers are metal such as, for example, copper or alloy 110. Vias such as the exemplar vias 23 connect the two conductive layers 64 and 66 and enable connection between conductive layer 64 and module contacts 20. In this preferred embodiment having a three-layer flex portion 28, the two conductive layers 64 and 66 may be devised in a manner so that one of them has substantial area employed as a ground plane. The other layer may employ substantial area as a voltage reference plane. The use of plural conductive layers provides advantages and the creation of a distributed capacitance intended to reduce noise or bounce effects that can, particularly at higher frequencies, degrade signal integrity, as those of skill in the art will recognize. If more than two conductive layers are employed, additional conductive layers may be added with insulating layers separating conductive layers. Flex circuit portions 28 and 24 may in some embodiments be rigid portions (rigid-flex). Construction of rigid-flex circuitry is known in the art.

With the construction of an embodiment such as that shown in FIG. 6, thermal energy will be urged to move from IC $18_1$ into substrate 14 as exemplified by thermal vector $T_1$ and from IC $18_1$ into IC $18_2$ when IC $18_1$ is active. Thus, IC $18_2$ assists in cooling IC $18_1$, consequently providing improved thermal dissipation as the heat traveling from IC $18_1$ travels more readily through flex circuit 12 and the contacts 63 than through less thermally conductive materials such as PCB materials. Further, flex circuit 12 may be particularly devised to operate as a heat spreader or sink adding to the thermal conduction out of ICs $18_1$ and $18_2$.

Figure 7:
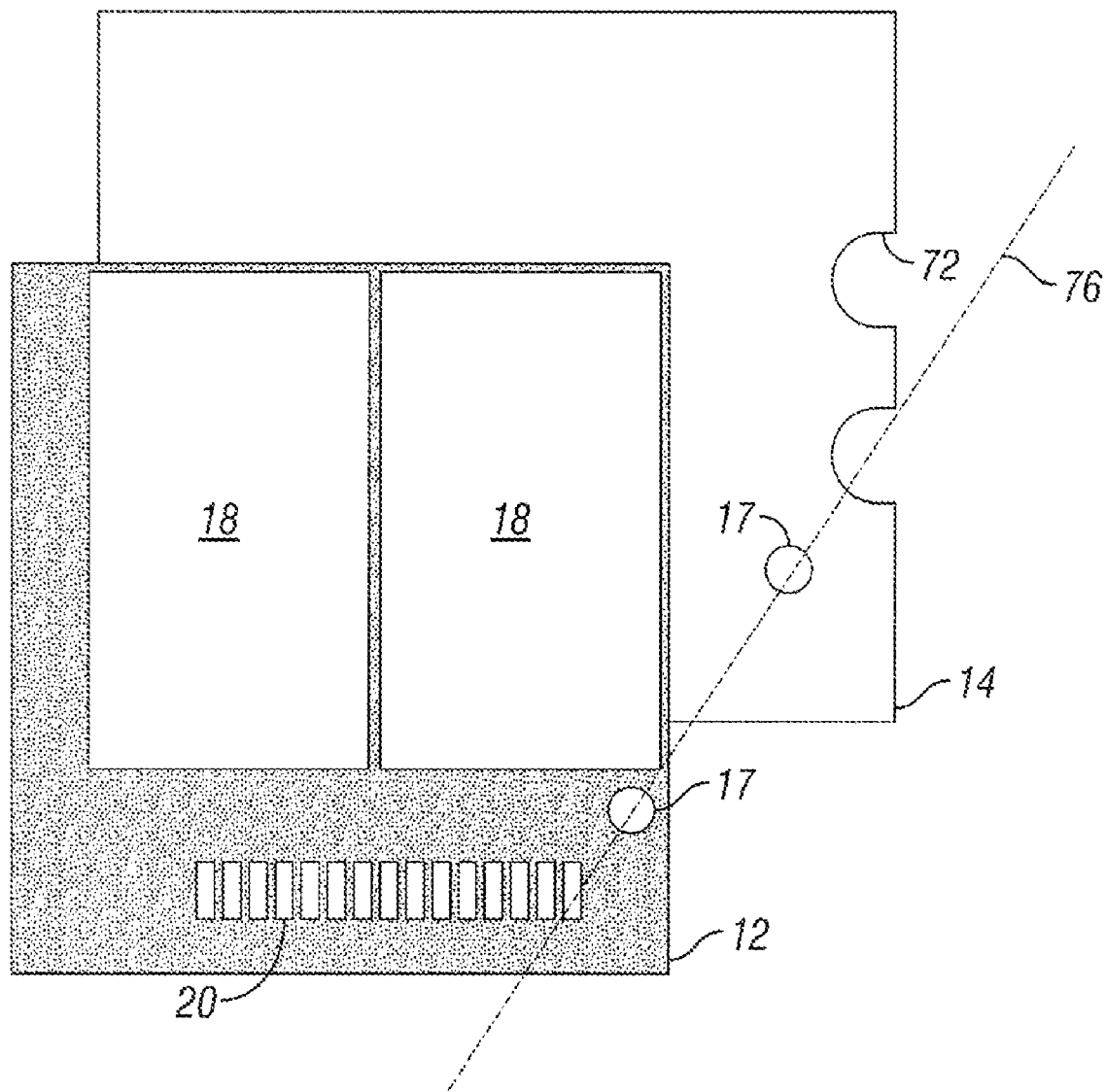
FIG. 7 depicts a cutout portion of a flex circuit and substrate according to one preferred, embodiment.

FIG. 7 depicts a cutout portion of a flex circuit 12 and substrate 14 according to one preferred embodiment. Flex 12 has openings 17 for use in aligning flex 12 to substrate 14 during assembly. Such alignment may be accomplished by inserting a tooling piece along the path depicted by dotted line 76 through opening 17 on flex 12 and through corresponding opening 17 on substrate 14. Multiple openings 17 which may function as tooling holes may appear in various places. Further, the alignment between flex circuit 12 and substrate 14 may also be implemented, for example, with an opening and protrusion combination such as a slot and tab arrangement or a hole and pin arrangement, for example. Those of skill will be able to readily adapt the teachings of this disclosure to devise corresponding opening and protrusion arrangements for alignment of flex and substrate in accordance with the present invention.

Depicted are indents 72 which may be required by certain card edge connectors. Similar indents will typically appear along edge 16 (FIG. 5) of substrate 14 and may require corresponding holes or indents in flex circuit 12 to match mechanical features on certain card edge connectors.

Figure 8:
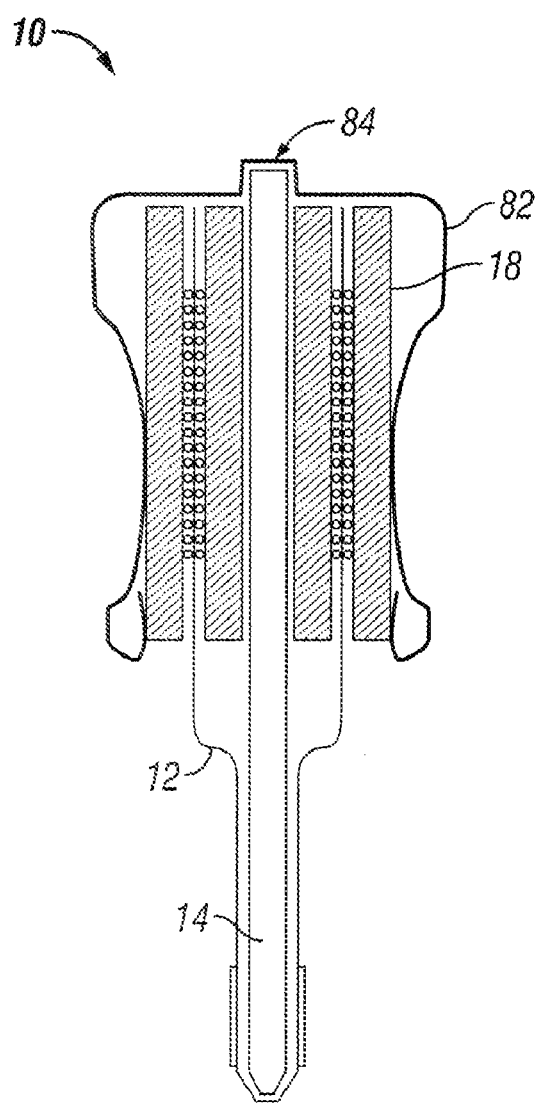
FIG. 8 depicts another embodiment of the present invention having a clip.

FIG. 8 depicts another embodiment having a clip. In this embodiment, clip 82 is depicted clipped around ICs 18. Clip 82 is preferably made of metal or other heat conducting material. Preferably, clip 82 has trough 84 devised to mate with the end of substrate 14. The attachment may further be accomplished with adhesive between clip 82 and substrate 14 or ICs 18.

Figure 9:
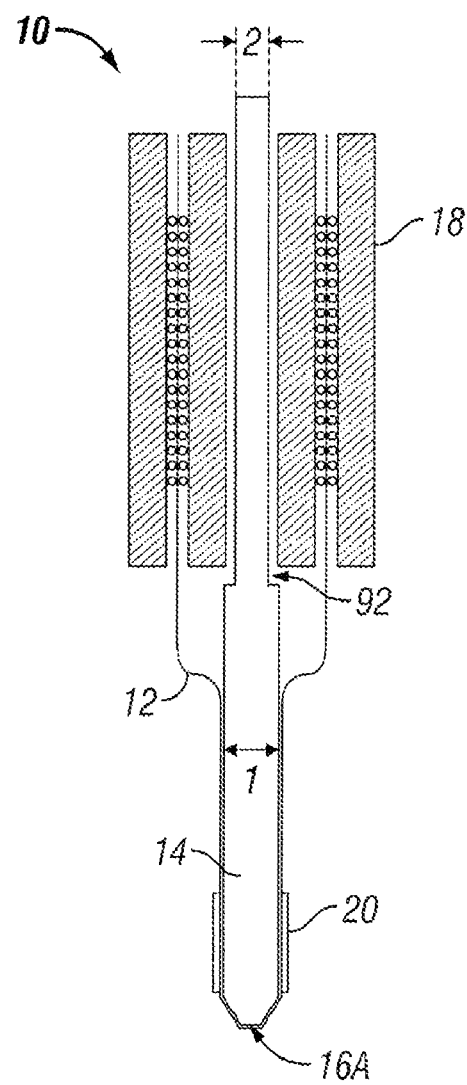
FIG. 9 depicts another embodiment having a thinned portion of substrate.

FIG. 9 depicts another embodiment having a thinned portion of substrate 14. In this embodiment, substrate 14 has a first thickness 1 toward edge 16A devised to provide support for an edge and surrounding area of module assembly 10 as may be needed for connection to a card edge connector. Above the portion of substrate 14 with thickness 1 is a portion 92 having thickness 2. The narrower width of portion 92 is devised to narrow the total width of module assembly 10 and may provide for enhanced cooling airflow or more dense spacing of module assemblies 10 in their operating environment.

FIG. 10 is a cross-sectional view of another preferred embodiment. The depiction is facing down. Substrate 14 is selectively thinned at portion 102 under device 104. Depicted device 104 has an exposed die 106 mounted on a substrate. Other embodiments may have otherwise packaged or mounted integrated circuits or other devices with heights greater than the typical IC 18. ICs 18 are in preferred embodiments memory CSPs all having similar heights. In this embodiment, device 104 is taller than the other ICs 18 populating the flex 12. Thinned portion 102 of substrate 14 underneath device 104 accommodates the extra height so that flex 12 remains planer and the upper surface of device 104 contacts substrate 14. Substrate 14 may be manufactured for this or other similar embodiments with a variety of method such as, for example, by being milled with a CNC (computer numerical controlled) machine, or being extruded, for example. This and similar embodiments may be employed to advantage to provide advantageous heat performance when device 104 is a FB-DIMM advanced memory buffer (AMB). Device 104 is preferably attached to substrate 14 with heat conductive adhesive.

FIG. 11 depicts another embodiment having an extended substrate 14. Depicted extension 112 of substrate 14 extends beyond the top of flex 12. Extension 112 is shaped to provide additional surface area for convective cooling. Such shape may be achieved by methods such as, for example, milling or extrusion, which are both known in the art. Preferably, extruded aluminum is used for substrate 14 in this and similar embodiments.

FIG. 12 depicts another embodiment of the invention having additional layers of ICs 18. In this embodiment, four flex level transitions 26 connect to four mounting portions 28. Each mounting portion 28 has ICs 18 on both sides. Flex circuitry 12 may be provided in this configuration by, for example, having a split flex with layers interconnected with vias at portion 24 of flex 12. Further, two flex circuits may be used and interconnected by pad to pad contacts or inter-flex contacts.

FIG. 13 depicts another embodiment having flex portions wrapped around opposing edges of substrate 14. Flex circuit 12 has connecting portion 132 wrapped around form portion 134 of substrate 14. Form portion 134 is a type of perimeter edge 16B shaped to provide a larger surface for transit of the flex circuit. In a preferred methodology for assembling this embodiment, the depicted ICs 18 are first mounted to flex circuit 12. Flex portion 26 associated with IC 18a is placed in position relative to the substrate. Flex circuit 12 is then wrapped around edge 16 of substrate 14 a first time. Appropriate adhesive lamination or other techniques are used to attach flex 12 and ICs 18a and 18b to substrate 14. Connecting portion 132 of flex circuit 12 is wrapped around form portion 134. Adhesive may be used to make back-to-back connections between the depicted ICs 18. Lamination or other adhesive or bonding techniques may be used to attach the two layers of flex 12 to each other at flex portions 24. Further, the two layers of flex circuitry 12 wrapped around edge 16A may interconnected with by pad to pad contacts or inter-flex contacts. Flex 12 is wrapped again around edge 16A, putting IC 18c into position. IC 18d is positioned back-to-back with IC 18e and attached.

FIG. 14 depicts another embodiment having a flex portion wrapped around opposing edges of substrate 14. Flex circuit 12 has connecting portion 132 wrapped around form portion 134 of substrate 14. Connecting portion 132 preferably has more than one conductive layer, and may have three or four or more conductive layers. Such layers may be beneficial to route signals for applications such as, for example, a FB- DIMM (fully-buffered DIMM) which may have less DIMM input/output signals than a registered DIMM, but may have more interconnect traces required among devices on the DIMM, such as, for example, the C/A copy A and C/A copy B (command/address) signals produced by an FB-DIMM advanced memory buffer (AMB). Flex 12 terminates at end 136, which may be at the level of flex portion 28 or may extend to the level of portion 24 and be attached to substrate 14. While two sets of module contacts 20 are shown, other embodiments may have only one set and may not have flex 12 wrapped around edge 16A of substrate 14.

FIG. 15 depicts a cross-sectional view of another alternative embodiment of the present invention. Flex circuit 12 exhibits contacts 20 proximal to opposing edges 192. Connecting portion 132 of flex circuit 12 is wrapped about form portion 134 of substrate 14. Contacts 20 are, in this embodiment, arranged proximal to opposite edges 192 of flex circuit 12. In a preferred methodology for assembling this embodiment, the depicted ICs 18 are first mounted to flex circuit 12. Flex circuit 12 is wrapped about form portion 134 of substrate 14 and preferably aligned to substrate 14 with tooling holes. Portion 24 of flex circuit 12 is preferably laminated to substrate 14.

Figure 16:
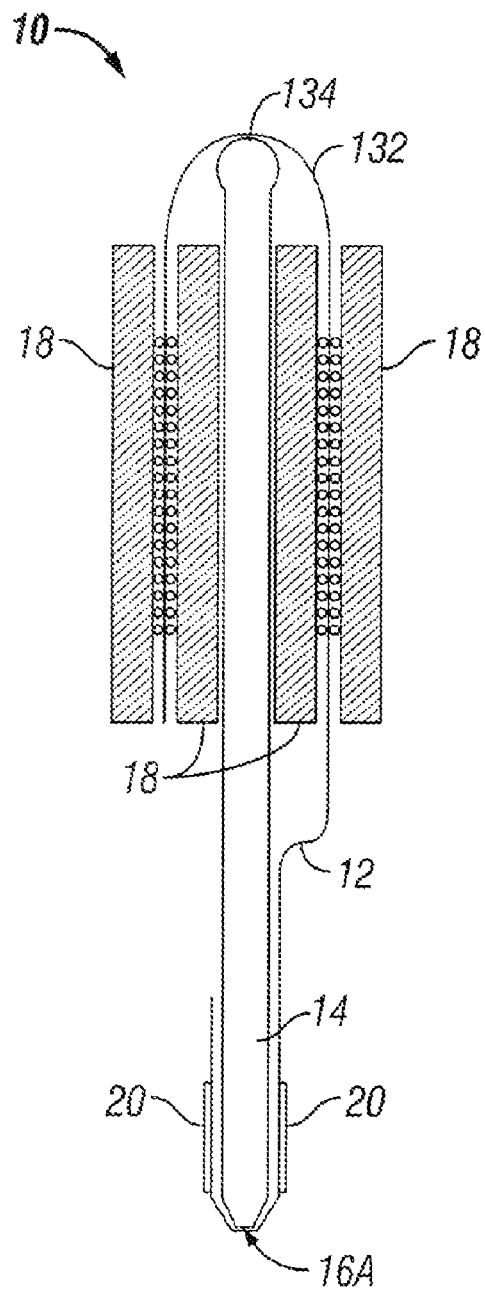
FIG. 16 depicts an alternative embodiment of the present invention.

FIG. 16 depicts an alternative embodiment of the present invention.

Figure 17:
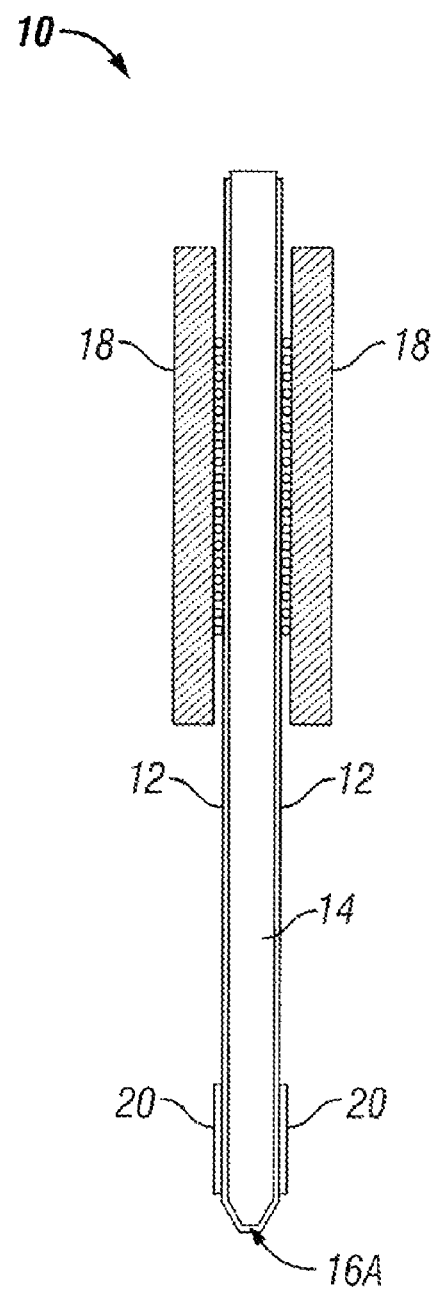
FIG. 17 depicts an alternative embodiment of the present invention having CSPs on the external side of a flex circuit.

FIG. 17 depicts an alternative embodiment of the present invention having CSPs on the external side of a flex circuit.

FIG. 18 depicts an alternative embodiment of the present invention having CSPs mounted between a flex circuit and substrate.

FIG. 19 depicts an alternative embodiment of the present invention in which the flex circuit transits over an end of the substrate opposite the module contacts.

Figure 20:
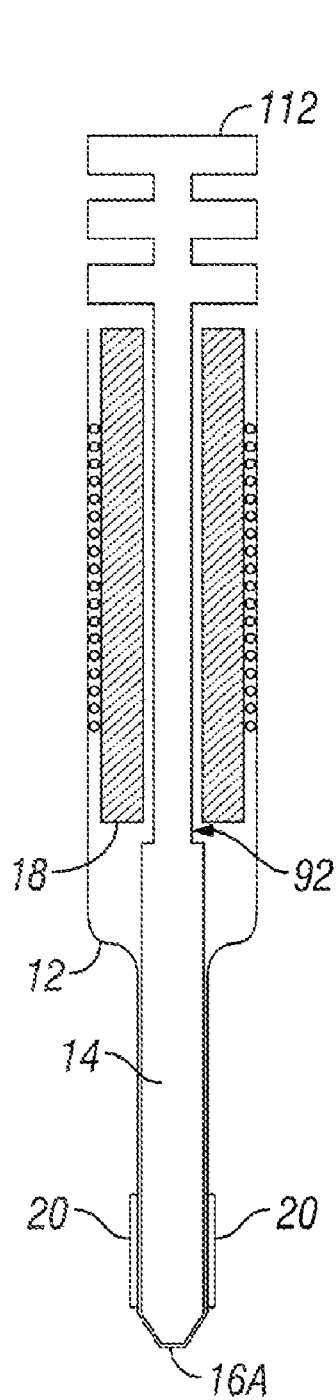
FIG. 20 is a preferred embodiment of the present invention similar to that depicted in earlier FIG. 11.

FIG. 20 is a preferred embodiment of the present invention similar to that depicted in earlier FIG. 11.

Figure 21:
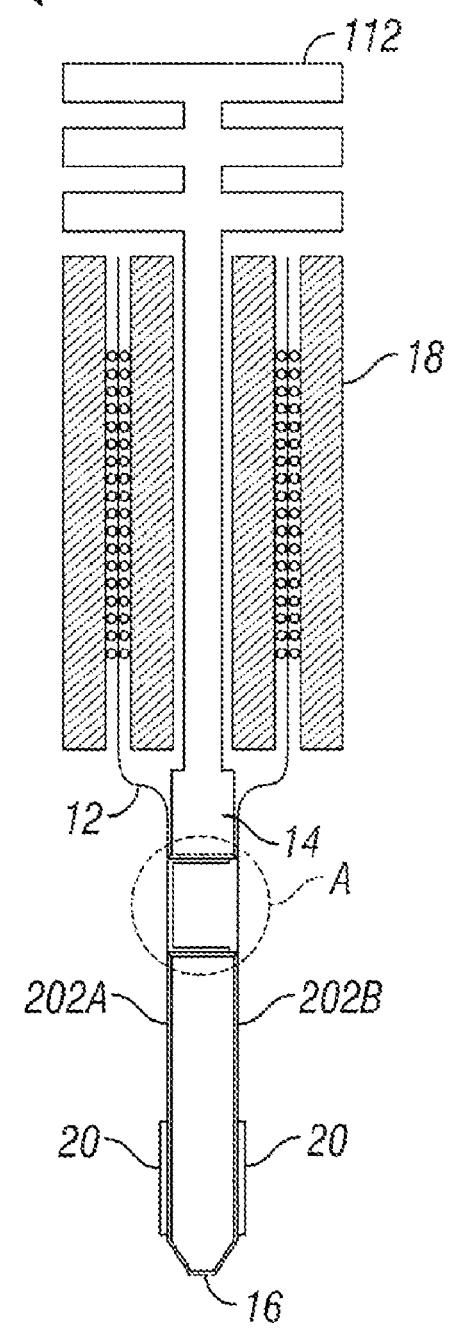
FIG. 21 depicts an alternative embodiment of the present invention in which a connector provides selective interconnective facility between parts of the flex circuit on opposite lateral sides of the substrate.
Figure 22:
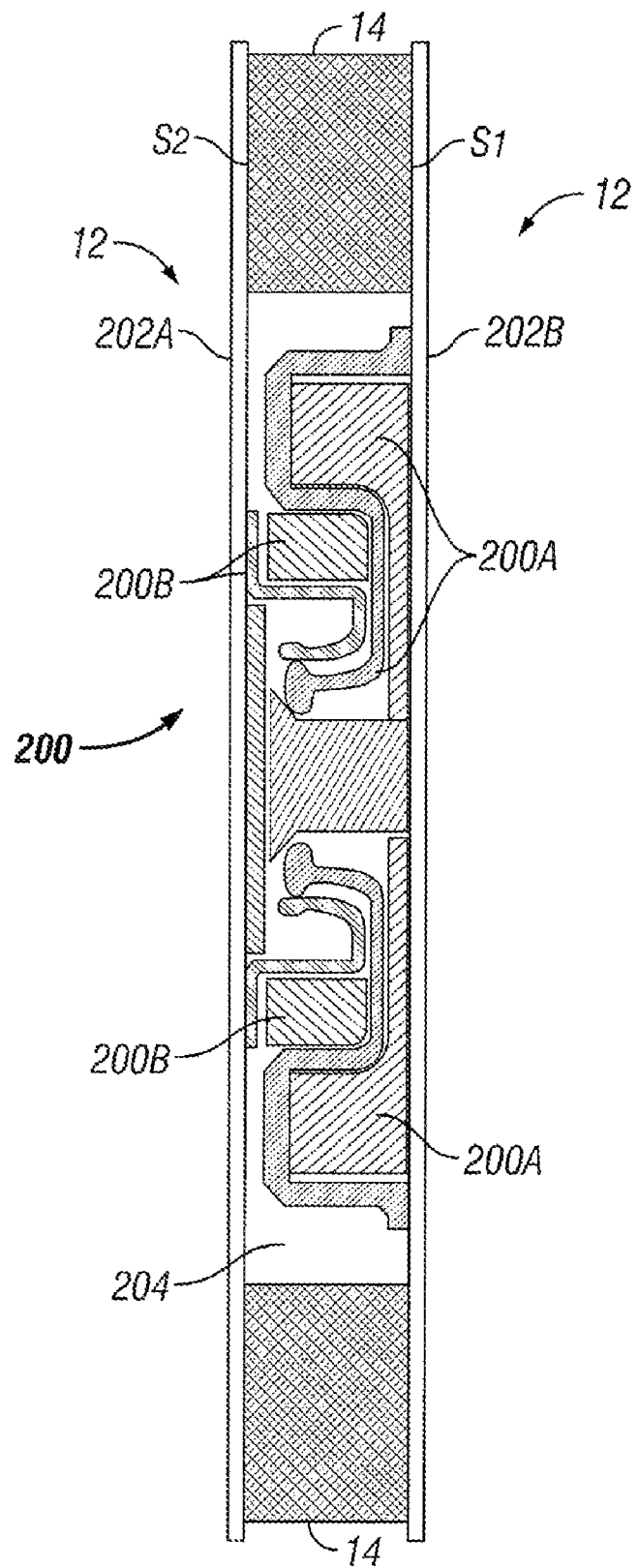
FIG. 22 depicts details from the area marked "A" in FIG. 21.

FIGS. 21 and 22 depict an alternative embodiment of the present invention that employs a connector 200 to provide selective interconnection between portions 202A and 202B of flex circuit 12 associated respectively with lateral sides $S_1$ and $S_2$ of substrate 14. The depicted connector 200 has first part 200B and 200A that interconnect in cavity 204 of flex circuit 12. One example of connector 200 is a 500024/50027 Molex connector but a variety of different connectors may be employed in embodiments of the invention. The depicted connector 200 is disposed in substrate cavity and typically will have a first part 200A and a second part 200B.

FIGS. 23 and 24 depict an alternative circuit module. In the embodiment shown in FIGS. 23 and 24 flex circuit 12 is a rigid flex. FIG. 23 is an elevation view. FIG. 24 is a cross-sectional view. As shown, flex circuit 12 has two rigid portions 13 connected by a bend 31 at the flexible region. Imposing bend 31 in flex circuit 12 creates an open-ended pocket 32 into which may be at least partially inserted a support or substrate 14 as shown in earlier FIGS. and/or a heat spreader such as heat spreader 152 shown in FIG. 24.

Both rigid portions 13 of flex circuit 12 have ICs 18 mounted on opposing sides. Heat spreader 152 shown between rows of ICs 18, may be attached to the upper major surface of one or both of the depicted ICs 18. Heat spreader 152 is preferably copper or other heat conductive metal or metal alloy. Contacts 20 are presented along the sides of rigid portion 13 proximal to edge 16. Contacts 20 and edge 16 are sized and arranged for insertion into a card edge connector or socket.

Figure 25:
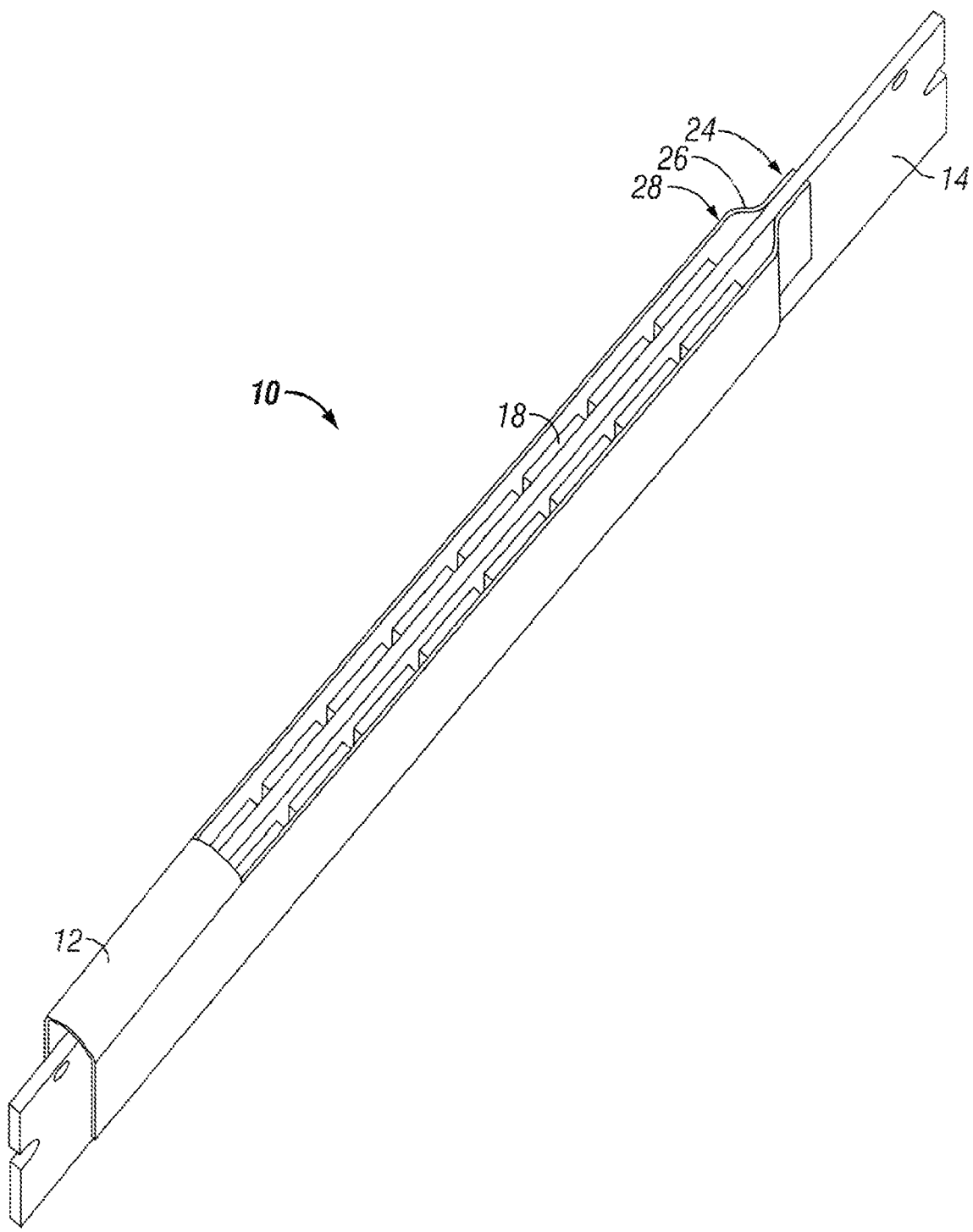
FIG. 25 is an elevation view of another embodiment of the alternative circuit module of FIG. 23.
Figure 26:
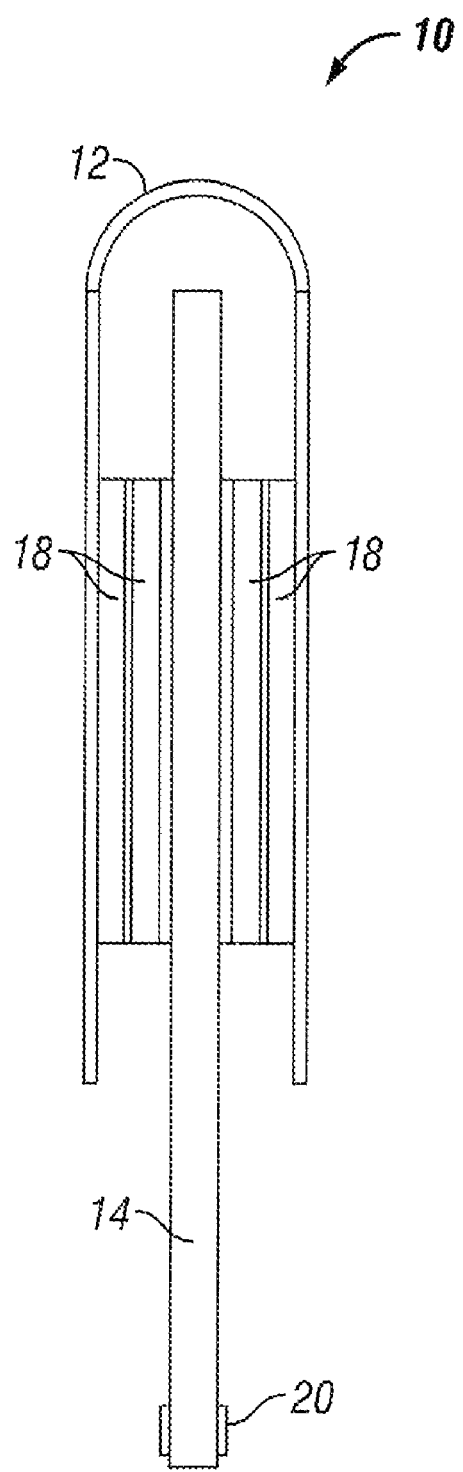
FIG. 26 is a cross-sectional view of the embodiment of FIG. 25.
Figure 27:
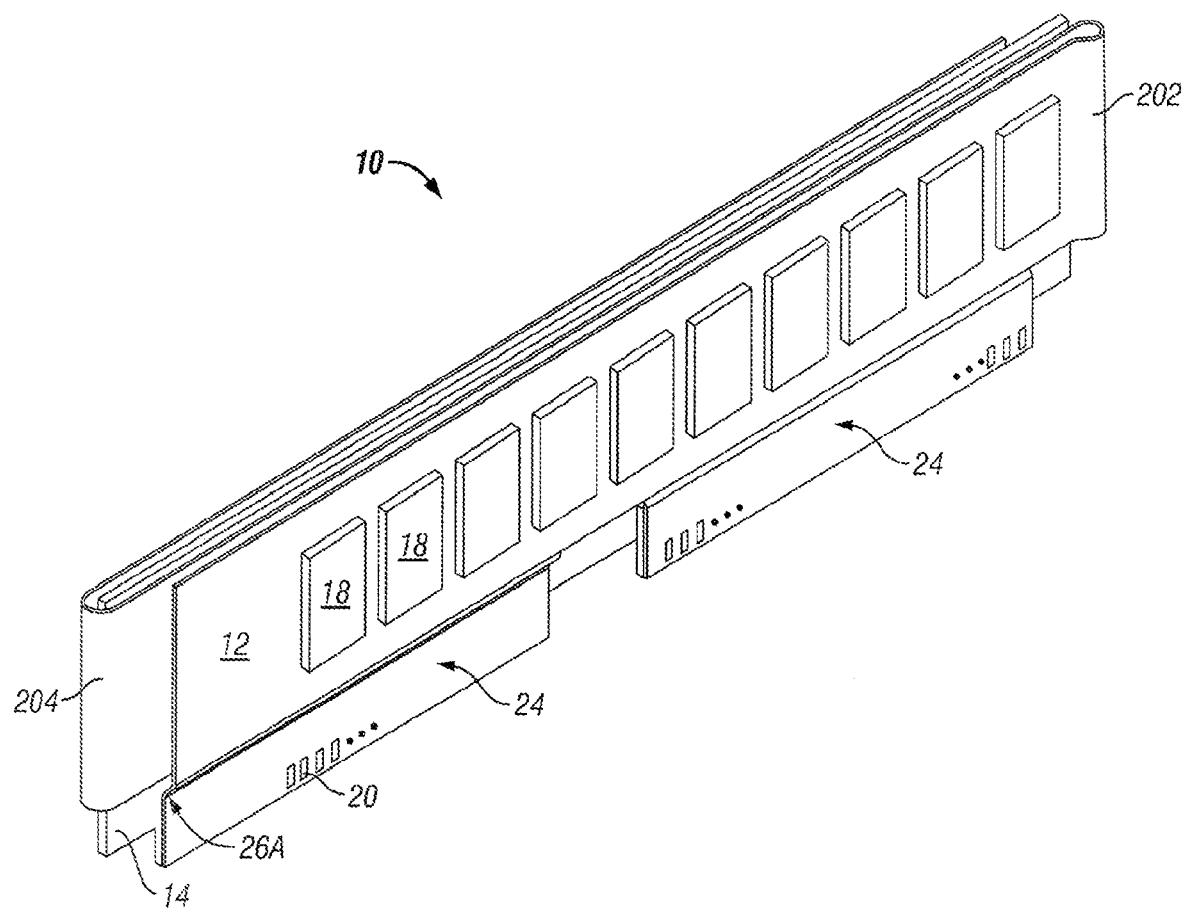
FIG. 27 is an elevation view of yet another alternative circuit module.
Figure 28:
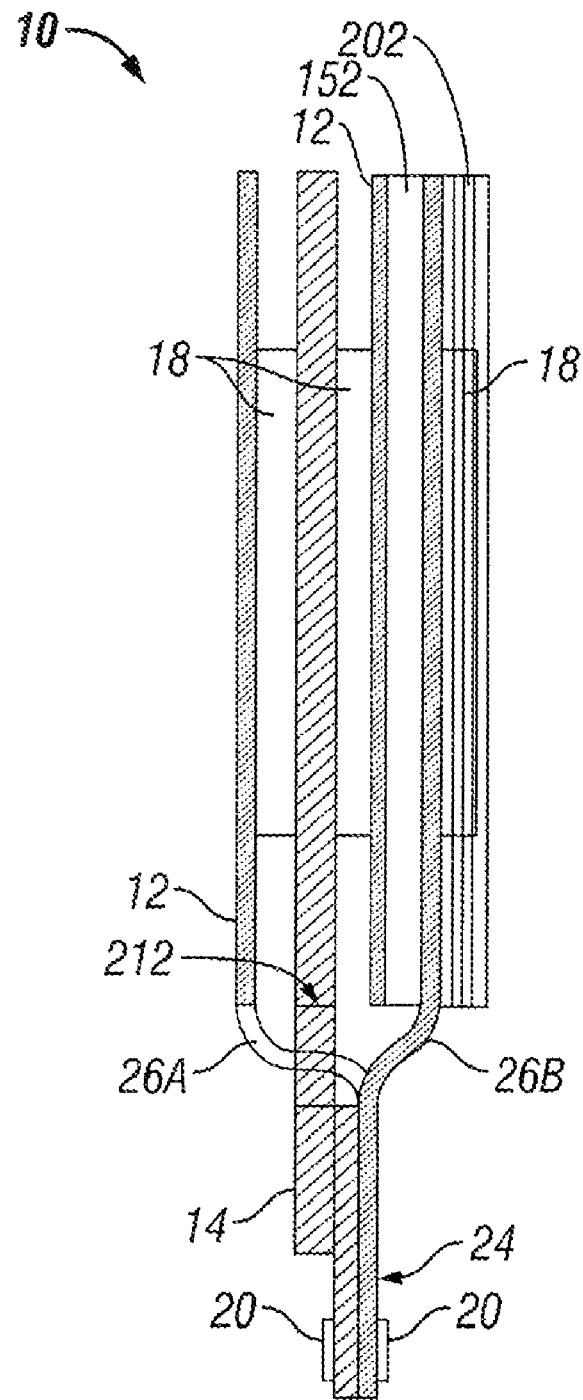
FIG. 28 is a cross-sectional view of the alternative circuit module of FIG. 27.

FIGS. 25 and 26 depict another alternative circuit module. FIG. 27 is an elevation view. FIG. 28 is a cross-sectional view. In this embodiment, substrate 14 is a circuit board preferably made of FR4 having etched copper layers. ICs 18 are mounted along substrate 14. Additional ICs 18 are mounted along flex circuit 12. Flex circuit 12 if folded over the top edge of substrate 12 to interconnect ICs 18 on flex circuit 12. The depicted adjacent ICs in FIG. 26 may be attached adhesively back-to-back and may be provided with a heat spreader 152 (FIG. 24) between them. Flex level transitions 26 bend from flex portion 28 to flex portion 24. Flex portion 24, in this embodiment, has contacts for electrical connection to substrate 14. Substrate 14 has contacts 20 for connection to a card edge connector or socket.

FIGS. 27 and 28 depict another alternative circuit module. FIG. 28 is an elevation view. FIG. 26 is a cross-sectional view. Flex circuit 12 is bent lengthwise about substrate 14 at bend 204. At bend 202, flex circuit 12 is bent back over heat spreader 152. Preferably, the upper major surfaces of the ICs 18 adjacent to substrate 14 are attached to substrate 14. Flex level transitions 26$_A$ and 26$_B$ bend to align portion 24 of flex circuit 12 for attachment to substrate 14. Flex transition 26$_A$ passes through slot 121 formed in substrate 14. In this alternative embodiment, substrate 14 is shaped in a manner devised to center contacts 20 in the cross-section. Some contacts 20 are depicted on substrate 14. In this embodiment, substrate 14 is preferably a circuit board made of FR4. Portions 24 of flex circuit 12 may have contact pads for electrical connection to corresponding contact pads on substrate 14. In other embodiments, flex circuit 12 may be folded about the edge of substrate 14 or contacts 20 may appear on only one side of module 10.

Although the present invention has been described in detail, it will be apparent to those skilled in the art that many embodiments taking a variety of specific forms and reflecting changes, substitutions and alterations can be made without departing from the spirit and scope of the invention. The described embodiments illustrate the scope of the claims but do not restrict the scope of the claims.

The invention claimed is:

1. A populated flexible circuit comprising:
a flexible circuit having a first major side and a second major side, the flexible circuit exhibiting along the first major side, first-side first and second sets of contact site arrays between which is located a row of connector contacts, the second major side of the flexible circuit exhibiting second-side first and second sets of contact site arrays which correspond to the first-side first and second sets of contact site arrays, each of the first-side and second-side first and second sets of contact site arrays comprising at least two surface mount arrays, the flexible circuit providing connections between the at least two surface mount arrays of each of the first-side first and second sets of contact site arrays and the at least two surface mount arrays of each of the second-side first and second sets of contact site arrays;
a plurality of CSPs that populate the at least two surface mount arrays of each of the first-side first and second sets of contact site arrays and the at least two surface mount arrays of each of the second-side first and second sets of contact site arrays; and
a support structure about which the flexible circuit transits through a bend such that the second-side first and second sets of contact site arrays face the support structure.

\* \* \* \* \*